(12) United States Patent
Morimoto et al.

(10) Patent No.: US 7,598,478 B2
(45) Date of Patent: Oct. 6, 2009

(54) IMAGE PICKUP DEVICE HAVING A LIGHT SHIELD ELEMENT

(75) Inventors: Takashi Morimoto, Suita (JP); Naoki Kubo, Takarazuka (JP); Kouichi Ishida, Sakai (JP); Satoru Hirose, Sakai (JP); Takeshi Endo, Osaka (JP)

(73) Assignee: Konica Minolta Holdings, Inc., Tokyo (JP)

( * ) Notice: Subject to any disclaimer, the term of this patent is extended or adjusted under 35 U.S.C. 154(b) by 483 days.

(21) Appl. No.: 11/409,431

(22) Filed: Apr. 21, 2006

(65) Prior Publication Data

US 2006/0237751 A1 Oct. 26, 2006

(30) Foreign Application Priority Data

Apr. 26, 2005 (JP) ............. 2005-127679
Apr. 26, 2005 (JP) ............. 2005-127680

(51) Int. Cl.
*H01L 27/00* (2006.01)
(52) U.S. Cl. ............ 250/208.1; 250/214.1; 250/351; 348/229.1
(58) Field of Classification Search ........ 250/214.1, 250/208.1, 214 R, 214 A, 214 AG, 214 C; 348/229.1, 30, 300, 311, 314, 315, 319; 257/232
See application file for complete search history.

(56) References Cited

U.S. PATENT DOCUMENTS 4,485,305 A * 11/1984 Kuwano et al. .......... 250/338.1

7,263,252 B2 * 8/2007 Nakano et al. ............. 385/18
7,359,481 B2 * 4/2008 Ikeda ..................... 378/62

FOREIGN PATENT DOCUMENTS

JP 6-70225 A 3/1994
JP 8-163449 A 6/1996

OTHER PUBLICATIONS

Fritz J. Kub et al, "Compressing Photodetectors for Long Optical Pulses Using a Lateral Blooming Drain Structure", *IEEE Transactions on Electron Devices,* vol. 40, No. 10, Oct. 1993, pgs. 1740-1744.
David Stoppa et al, "Novel CMOS Image Sensor With a 132-dB Dynamic Range", IEEE Journal of Solid-State Circuits, Vol. 37, No. 12, Dec. 2002, pgs. 1846-1852.

* cited by examiner

*Primary Examiner*—Thanh X Luu
*Assistant Examiner*—Tony Ko
(74) *Attorney, Agent, or Firm*—Sidley Austin LLP

(57) ABSTRACT

An image pickup device wherein the range in the amount of incident light (dynamic range) for obtaining an appropriate image can be expanded, and shutter and aperture functions are provided. A light shielding element for light shielding a photoelectric conversion section and an actuator for driving the light shielding element are provided on the pixel of the image pickup device using the MEMS technology, and the amount of light shielding is controlled for each pixel, whereby the dynamic range is expanded, and shutter and aperture functions are also provided.

16 Claims, 20 Drawing Sheets

FIG. 3 ( a )
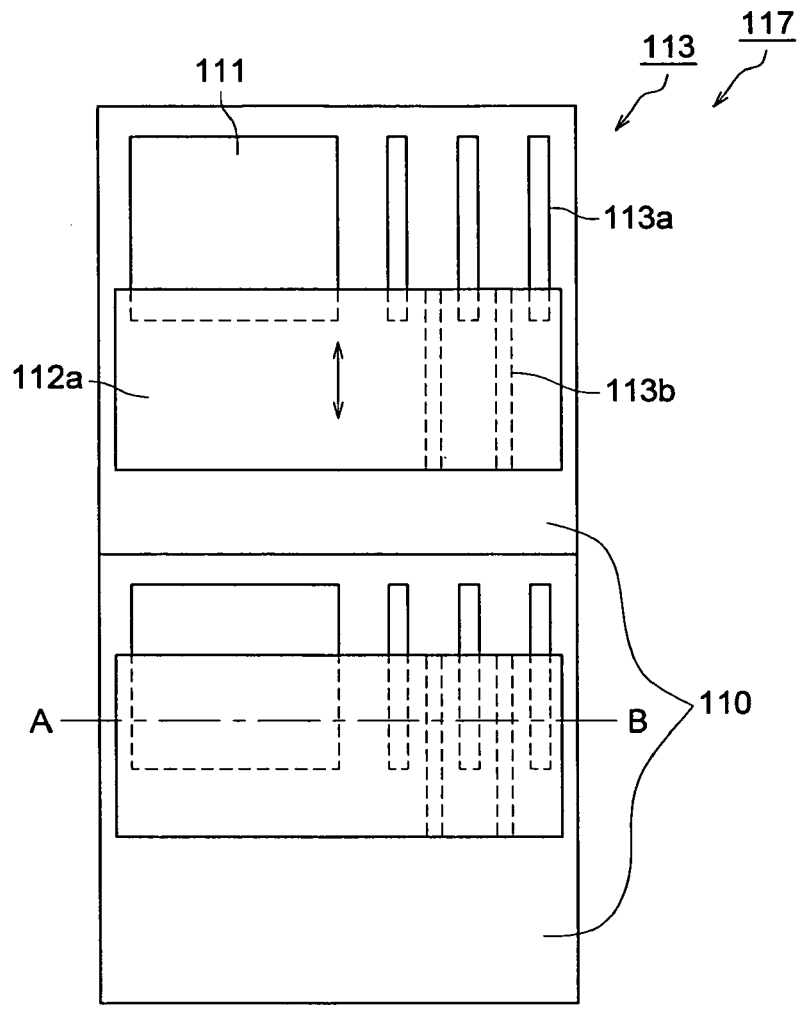
FIG. 3 ( b )
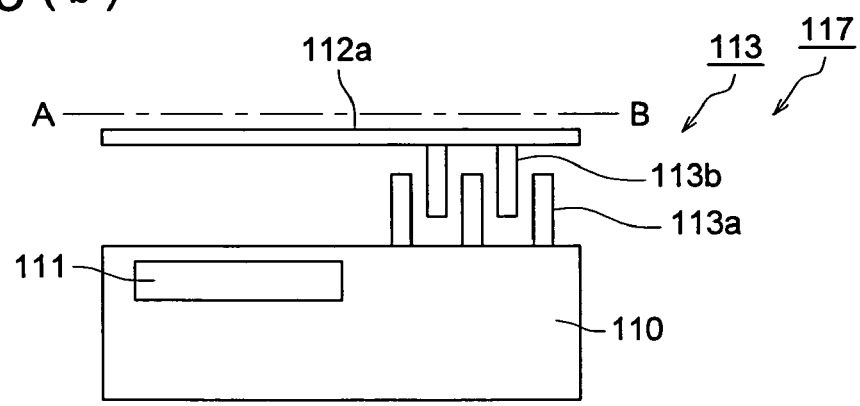

IMAGE PICKUP DEVICE HAVING A LIGHT SHIELD ELEMENT

This application is based on Japanese Patent Application No. 2005-127679 filed on Apr. 26, 2005, and No. 2005-127680 filed on Apr. 26, 2005, in Japanese Patent Office, the entire content of which is hereby incorporated by reference.

TECHNICAL FIELD

The present invention relates to an image pickup device, image pickup unit and image pickup apparatus, particularly to an image pickup device, image pickup unit and image pickup apparatus wherein the image pickup device is provided with a light shield element covering a photoelectric conversion section.

BACKGROUND

In the solid-state image pickup device as the conventional CCD (charge coupled device) type image pickup device or CMOS (Complementary Metal Oxide Semiconductor) type image pickup device, incident light is converted into electrical charge by the photoelectric conversion section arranged inside a pixel, and a video image is obtained. The incident light is converted into the electrical charge, whereby a picture signal is obtained. A photo-MOS gate and a photodiode are used as the photoelectric conversion section, for example. Both the CCD type image pickup device and CMOS type image pickup device are designed to store the electrical charge produced by the incident light for a predetermined exposure time. After the lapse of the time, signals corresponding to the amount of the stored electrical charge are outputted.

There is a limit to the amount of the electrical charge that can be stored. High-intensity incident light will cause the electrical charge to be saturated, and an appropriate output signal cannot be obtained. To prevent this, a restriction is imposed on the incident light by an optical device such as a filter and aperture. In this case, the amount of the electrical charge having been stored will be too small for the low-intensity incident light, and the output signal will be hidden among the surrounding noise, with the result that appropriate output signal cannot be obtained.

Thus, a solid-state image pickup device has an acceptable range of the amount of incident light (dynamic range). This range is generally very small, as compared with the wide dynamic range of the object to be imaged. Such being the case, there has been an intense demand for expansion of the dynamic range in a solid-state image pickup device.

In the conventional art, some attempts have been made to expand the dynamic range from the aspect of the solid-state image pickup device or signal processing. One of the attempts is exemplified by the technique wherein the electrical charge produced in the photodiode is discarded from a storage device in response to the amount of light, thereby avoiding saturation due to a great amount of incident light (e.g. Non-Patent Document 1). Another example is the technique wherein charging and discharging are repeated during exposure to get the amount of signal from the number of charging and discharging operations (e.g. Non-Patent Document 2).

In a further example, the front of the image pickup surface of the CCD type image pickup device is provided with a filtering device such as a transparent liquid crystal panel where there is a change in light transmittance. The light transmittance of the filtering device is controlled in response to the level of the picture signal outputted by the image pickup device, whereby the incident light per se is controlled to expand the dynamic range (e.g. Patent Document 1).

A still further example is given in the following proposal, although this is not intended to expand the dynamic range. Namely, a light shield mask for shielding a part of the aperture of each pixel is provided on the pixel of the image pickup device. The position of the light shield mask is changed using a micro-actuator and the resolution is improved by a plurality of image pickup operations, without having to increase the number of the pixels, in this proposal (e.g. Patent Document 2).

[Non-Patent Document 1]
Fritz J. Kub and Gordon Wood Anderson, "Compressing Photodetectors for Long Optical Pulses Using a Lateral Blooming Drain structure," IEEE Transactions on Electron Devices, vol. 40, No. 10, pp. 1740-1744, 1993.

[Non-Patent Document 2]
David Stoppa, Andrea Simoni, Lorenzo Gonzo, Massimo Gottardi and Gian-Franco Dalla Betta, "Novel CMOS Image Sensor With a 132-dB Dynamic Range," IEEE Journal of Solid-State Circuits, vol. 37, No. 12, pp. 1846-1852, 2002.

[Patent Document 1]
Unexamined Japanese Patent Application Publication No. H6-70225

[Patent Document 2]
Unexamined Japanese Patent Application Publication No. H8-163449

According to the method disclosed in the Non-Patent Document 1, however, noise is produced from the transistor used to control the amount of electrical charge to be discarded, with the result that a satisfactory picture signal may not be obtained. According to the method disclosed in the Non-Patent Document 2, an analog-to-digital conversion circuit is required for each pixel of the image pickup device. This will result in a reduction in the exposure area ratio of the pixel and an increase in the pixel size.

According to the method disclosed in the Patent Document 1, the front of the CCD type image pickup device is provided with a filtering device such as a transparent liquid crystal panel where there is a change in light transmittance. Due to a low transmittance at the transparent state (e.g. 0.5 or less in the liquid crystal panel), the contrast of the captured image is reduced, and a complete light shielding cannot be achieved at the black state (transmittance of about 0.01 at the black state). A separate mechanical shutter is required when the electrical charge is transferred. Such a problem is found in this Patent Document. Further, there is a big characteristic change in the material of the liquid crystal panel and others due to temperature, and therefore, a further restriction is imposed on the performances at a low temperature or a high temperature. Moreover, the response speed of the liquid crystal panel and others is in the order of several milliseconds. This results in a low transmission/shielding switching speed. Such being the case, adequate restriction on the amount of light cannot be imposed in the face of the abrupt change in the amount of light.

In the method of Patent Document 2, the aperture position is switched in chronological order by the change in the position of light shield relative to the aperture of the pixel. A high resolution is merely achieved by this arrangement. Patent Document 2 does not provide variable control of the amount of the light blocked, and fails to expand the dynamic range.

SUMMARY

An object of the present invention is to solve the aforementioned problems and to provide an image pickup device, image pickup unit and image pickup apparatus capable of expanding the acceptable range of the amount of light (hereinafter referred to as "dynamic range") for yielding an appropriate image, wherein a shutter function and aperture function are also provided. In view of foregoing, one embodiment of an image pickup device according to one aspect of the present invention is an image pickup device, comprising:

a plurality of pixels arranged two-dimensionally each of which has a photoelectric conversion section; and a light shielding device, the light shielding device comprises:

a light shielding element which variably shields all or a part of the photoelectric conversion section from incident light, the light shielding element at least one side of which is shorter than a distance between an pixel column and the adjoining pixel column; and a light shield drive section which moves the light shielding element on the photoelectric conversion section.

BRIEF DESCRIPTION OF THE DRAWINGS

FIG. 3(a) is a plain view representing a first embodiment of the light shielding device in the present invention;

FIG. 3(b) is a cross-section view representing a first embodiment of the light shielding device in the present invention;

DETAILED DESCRIPTION OF THE PREFERRED EMBODIMENT

Figure 1A:
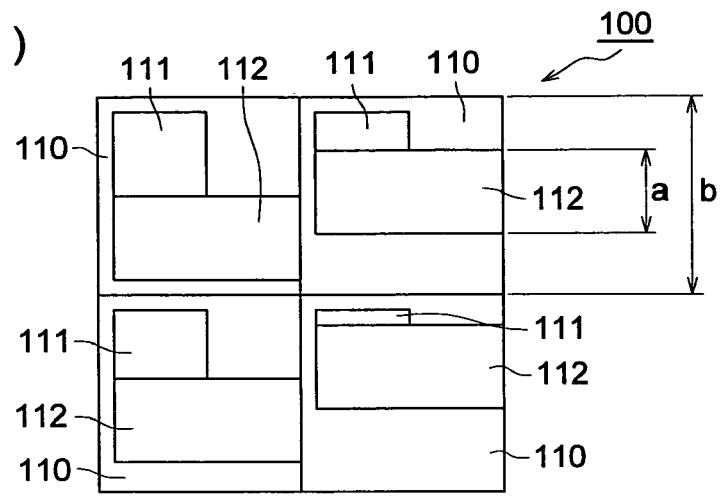
FIG. 1(a) is a schematic diagram representing the image pickup device as an embodiment of the present invention.

The following describes the embodiments of the present invention with reference to diagrams. The same reference numerals in the diagrams denote the same or equivalent portions, and will not be described to avoid duplication.

Figure 1B:
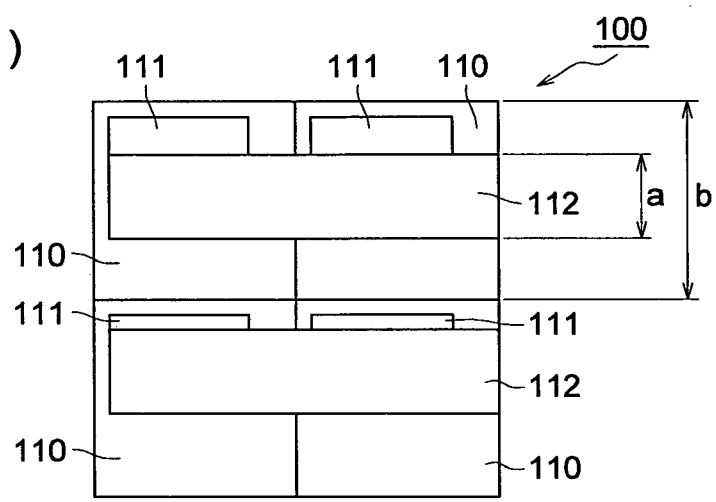
FIG. 1(b) is a schematic diagram representing the image pickup device as an embodiment of the present invention.
Figure 1C:
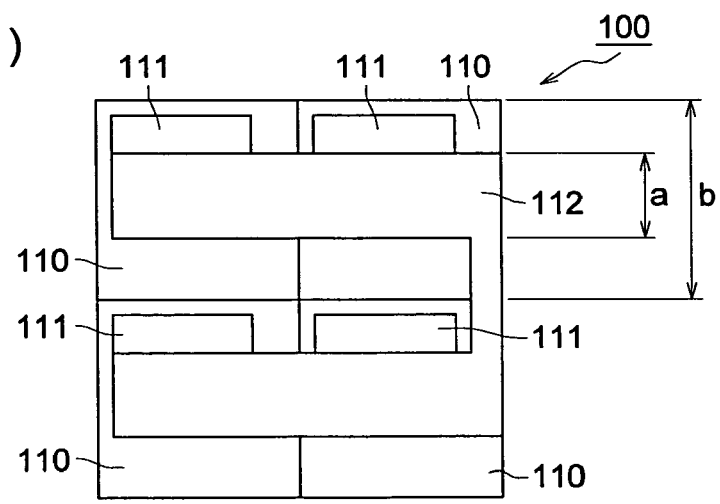
FIG. 1(c) is a schematic diagram representing the image pickup device as an embodiment of the present invention.

FIG. 1 is a schematic diagram representing the image pickup device as an embodiment of the present invention. It is a front view schematically showing the layout example of the light shielding element with respect to each pixel. FIG. 1 (a) shows an example wherein a light shielding element is arranged for each pixel. FIG. 1 (b) shows an example wherein light shielding elements of two pixels in the lateral direction are arranged as an integral member. FIG. 1 (c) shows an example wherein the light shielding elements of four pixels—two pixels in each longitudinal and lateral directions—are arranged as an integral member. For simplicity, an example of the two-dimensional array formed of two pixels in each longitudinal and lateral directions is illustrated here, but the number of the pixels of the present invention is not restricted thereto.

In FIG. 1, an image pickup device 100 is formed of a plurality of pixels 110. The pixel 110 has at least one photoelectric conversion section 111 to convert the incident light into an electrical signal. The photoelectric conversion output of the photoelectric conversion section 111 is outputted to an output circuit (not illustrated), and is outputted as a picture signal from the output circuit. The light shielding element 112 is so arranged as to variably shield all or part of the photoelectric conversion section 111 from the incident light.

In the structure shown in FIG. 1 (a), The light shielding element 112 is provided for each pixel. This arrangement allows the light shielding element to be operated independently for each pixel. Thus, fine and effective light shielding control is provided for each pixel. In the structure shown in FIGS. 1 (b) and (c), the light shielding element 112 is provided to cover a plurality of pixels. The factor of the area required for the arrangement of the light shielding elements 112 to the pixel area can be smaller than that of the structure shown in FIG. 1 (a). This permits the size of the photoelectric conversion section 111 to be increased. Thus, the sensitivity can be increased, without changing the pixel area. Further, according to the structure shown in FIG. 1 (c), the set of the pixels constituting the color (e.g. 4 pixels of R, G, G and B in the case of Bayer matrix arrangement) can be shielded by one light shielding element. The same light shielding factor of the set of pixels can be used. This simplifies the procedure for color balance correction in the later stage.

Figure 2:
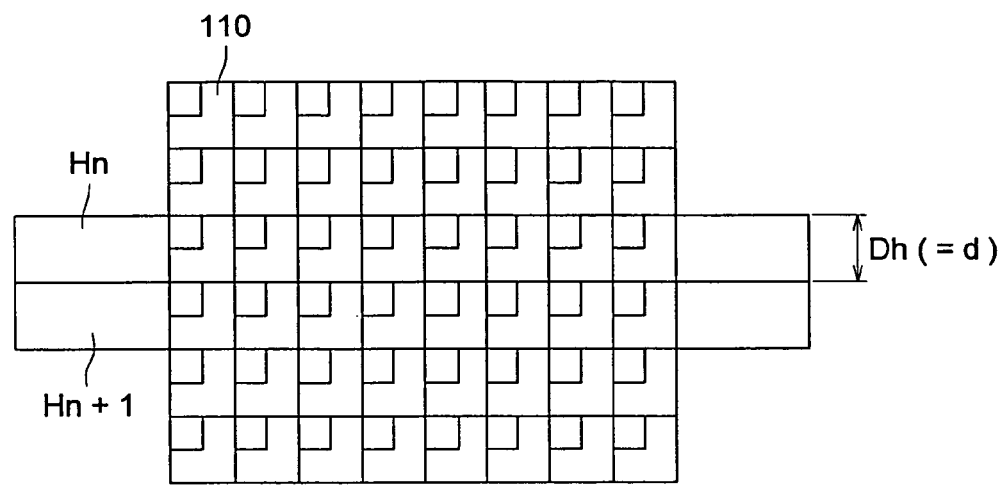
FIG. 2(a) is a schematic diagram representing the pixel array to define the column-to-column distance.
FIG. 2(b) is a schematic diagram representing the pixel array to define the column-to-column distance.
Figure 2:
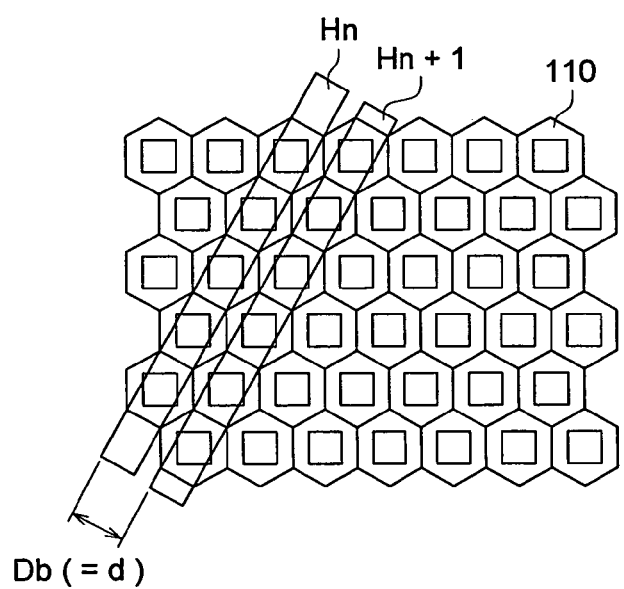

As shown in FIG. 1 (a), the length of at least one side of the light shielding element 112 is set at a value smaller than the column-to-column distance in the array of the pixels 110 (hereinafter referred to as "column-to-column distance) d. This is also applicable to the cases of FIG. 1 (b) and FIG. 1 (c). The following describes the details of the column-to-column distance d with reference to FIG. 2. FIG. 2 is a schematic diagram representing the array of the pixels 110 to define the column-to-column distance.

In FIG. 2 (a), when the rectangular pixels 110 are arranged in the horizontal and vertical directions, consider the arrangement Hn of adjacent pixels in the n-th column in the horizontal direction and the arrangement Hn+1 of the pixels in the n+1st column, by way of an example. The column-to-column distance d is the distance between the Hn and Hn+1, namely, pixel pitch Dh. The same principle also applies in the vertical direction. On the other hand, in the image pickup device having a structure where the hexagonal pixels 110 are closely packed (so-called honeycomb structure), as shown in FIG. 2 (b), the principle of FIG. 2 (a) applies in the horizontal and vertical directions. For the oblique direction, however, consider the arrangement Hn of adjacent pixels in the n-th column in the oblique direction shown in FIG. 2 (b) and the arrangement Hn+1 of the pixels in the n+1st column, by way of an example. The column-to-column distance d is the distance between the Hn and Hn+1, namely, oblique pixel pitch Db (See FIG. 2 (b)). If a plurality of column-to-column distances are present in response to such a pixel arrangement, the length of at least one side of the light shielding element 112 is set at a value smaller than at least one column-to-column distance.

Figure 4:
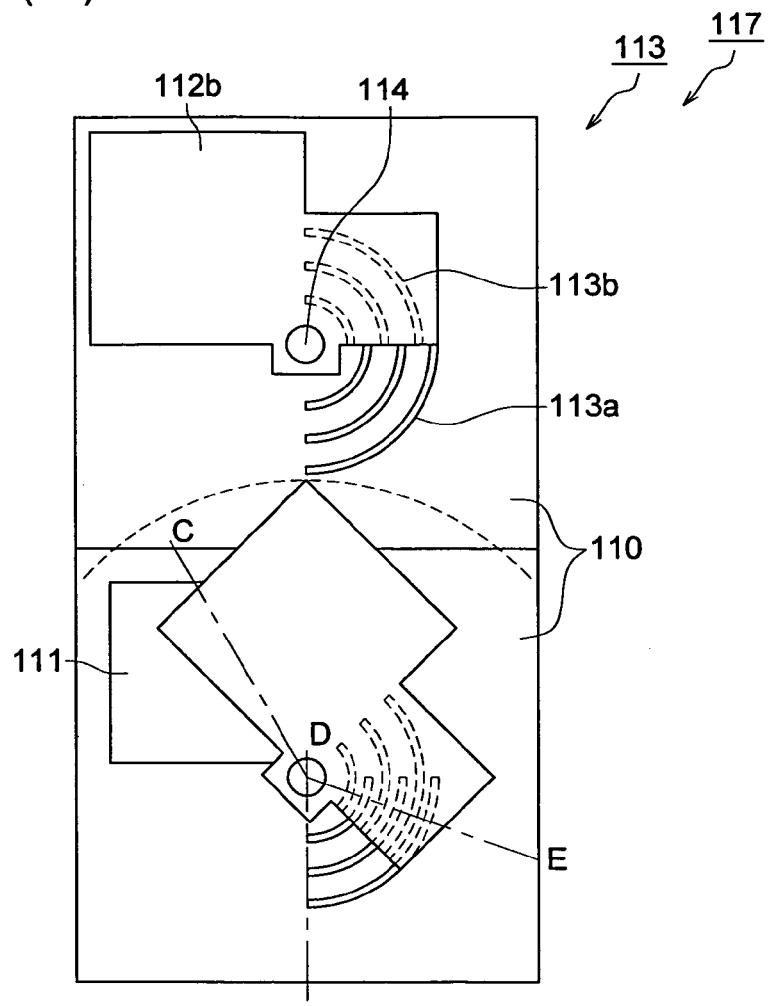
FIG. 4(a) is a plain view representing a second embodiment of the light shielding device in the present invention.
FIG. 4(b) is a cross-section view representing a second embodiment of the light shielding device in the present invention.
Figure 4:
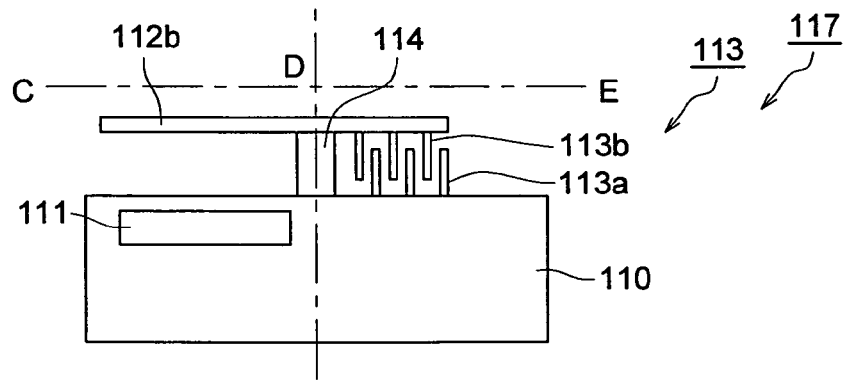
Figure 5:
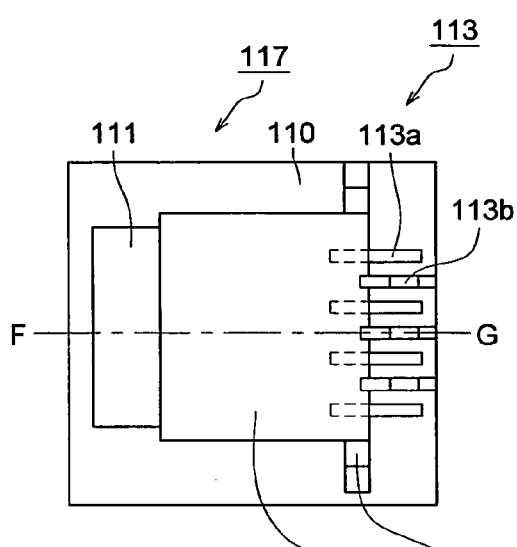
FIG. 5(a) is a schematic diagram of a third embodiment of the light shielding device in the present invention representing one pixel as observed from the image pickup side of the image pickup device 100.
FIG. 5(b) is a schematic diagram of a third embodiment of the light shielding device in the present invention representing a view as observed from the side G of FIG. 5 (a)
FIG. 5(c) is a cross-section view representing a third embodiment of the light shielding device in the present invention.
Figure 5:
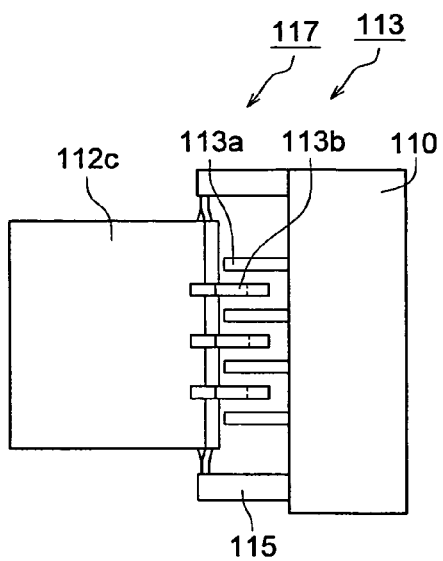
Figure 5:
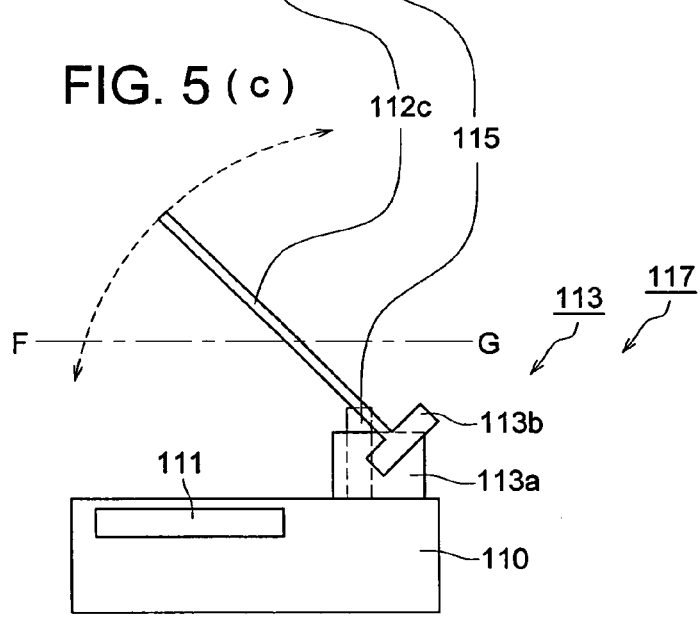

Referring to FIGS. 3, 4 and 5, the following describes a more specific example of the structure of the light shielding device 117. The light shielding device 117 is made up of a light shielding element 112 and a light shield drive section 113 for moving the light shielding element 112 on the photoelectric conversion section 111.

FIG. 3 (a), FIG. 3 (b) is a schematic diagram representing a first embodiment of the light shielding device 117. It is a schematic diagram showing an example wherein a plurality of light shielding elements 112a constituting the light shielding device 117 move parallel to each other on the pixel 110. FIG. 3 (a) is a view showing two pixels from the image pickup side of the image pickup device 100. FIG. 3 (b) is a cross sectional view showing the Section A-B of FIG. 3 (a). In the present example, the first comb electrode 113a constituting the light shielding drive section 113 is provided on the surface of the pixel 110, and the second comb electrode 113b is arranged on the light shielding element 112a. The light shielding elements 112a are moved linearly parallel to each other in the vertical direction by electrostatic force between the first comb electrode 113a and the second comb electrode 113b. Such being the case, the amount of light shielding of the photoelectric conversion section 111 can be controlled by controlling the voltage applied between the first comb electrode 113a and the second comb electrode 113b.

FIG. 4 (a), FIG. 4 (b) is a schematic diagram representing a second embodiment of the light shielding device 117. It shows an example wherein a plurality of light shielding elements 112b constituting the light shielding device 117 rotates around the rotary axis 114 on the pixel 110. FIG. 4 (a) is a view showing two pixels from the image pickup side of the image pickup device 100. FIG. 4 (b) is a cross sectional view showing the Section C-D-E of FIG. 4 (a). In the present example, the first comb electrode 113a constituting the light shield drive sections 113 is provided on the surface of the pixel 110, and the second comb electrode 113b is arranged on the light shielding element 112b in a concentric arc around the rotary axis 114. The light shielding element 112b is rotated around the rotary axis 114 by electrostatic force between the first comb electrode 113a and the second comb electrode 113b. The amount of the light shielding of the photoelectric conversion section 111 can be controlled by controlling the voltage applied between the first comb electrode 113a and the second comb electrode 113b.

FIG. 5 (a), FIG. 5 (b) and FIG. 5 (c) is a schematic diagram representing a third embodiment of the light shielding device 117. It shows an example wherein a plurality of light shielding elements 112c constituting the light shielding device 117 rotate between the position where they cover the photoelectric conversion section 111 around the fulcrum 115 and the position where they move away from the photoelectric conversion section 111. FIG. 5 (a) is a view of one pixel as observed from the image pickup side of the image pickup device 100. FIG. 5 (b) is a view as observed from the side G of FIG. 5 (a). FIG. 5 (c) is a cross sectional view of the Section F-G in FIG. 5 (a). In this example, the first comb electrode 113a constituting the light shield drive section 113 is provided on the surface of the pixel 110, and the second comb electrode 113b is arranged on the end of the plate-formed member 112c. The light shielding element 112c is rotated between the position where The light shielding elements 112 (112a, 112b and 112c) are designed in a compact configuration on the order of several microns, and therefore, can be driven at a high speed. They cut off light much faster than the liquid crystal device and electrochromic element used as a general optical switch. The light shielding factor at the time of complete light shielding is much higher than that of the liquid crystal or electrochromic element. This makes it possible to expand the dynamic range by control of the amount of the incident light, as well as to control the amount of light to be blocked, independently of the amount of incident light. Thus, the amount of incident light can be controlled in the manner similar to the camera aperture. Alternatively, control can be provided so that light is completely blocked upon completion of image pickup, thereby getting the same effect as that of a shutter. Particularly, simultaneous exposure of all the pixels (so-called global shutter function) can be done by simultaneous control of the light shielding elements 112 of all the pixels. A very high shutter speed is also provided.

As described above, the liquid crystal and others are subjected to a considerable change in viscosity due to temperature and other conditions. Thus, the temperature range capable of ensuring light shielding performance is very limited. The light shielding device as in the present embodiment changes the position thereof through mechanical movement of the light shielding element. So, it is possible to choose material impervious to the temperature change such as inorganic material. This ensures a very wide operating temperature range.

The energy for driving the light shielding device 117 is supplied via the connection wire leading from the light shielding control section 123 to be described later to the light shield drive section 113.

Figure 6:
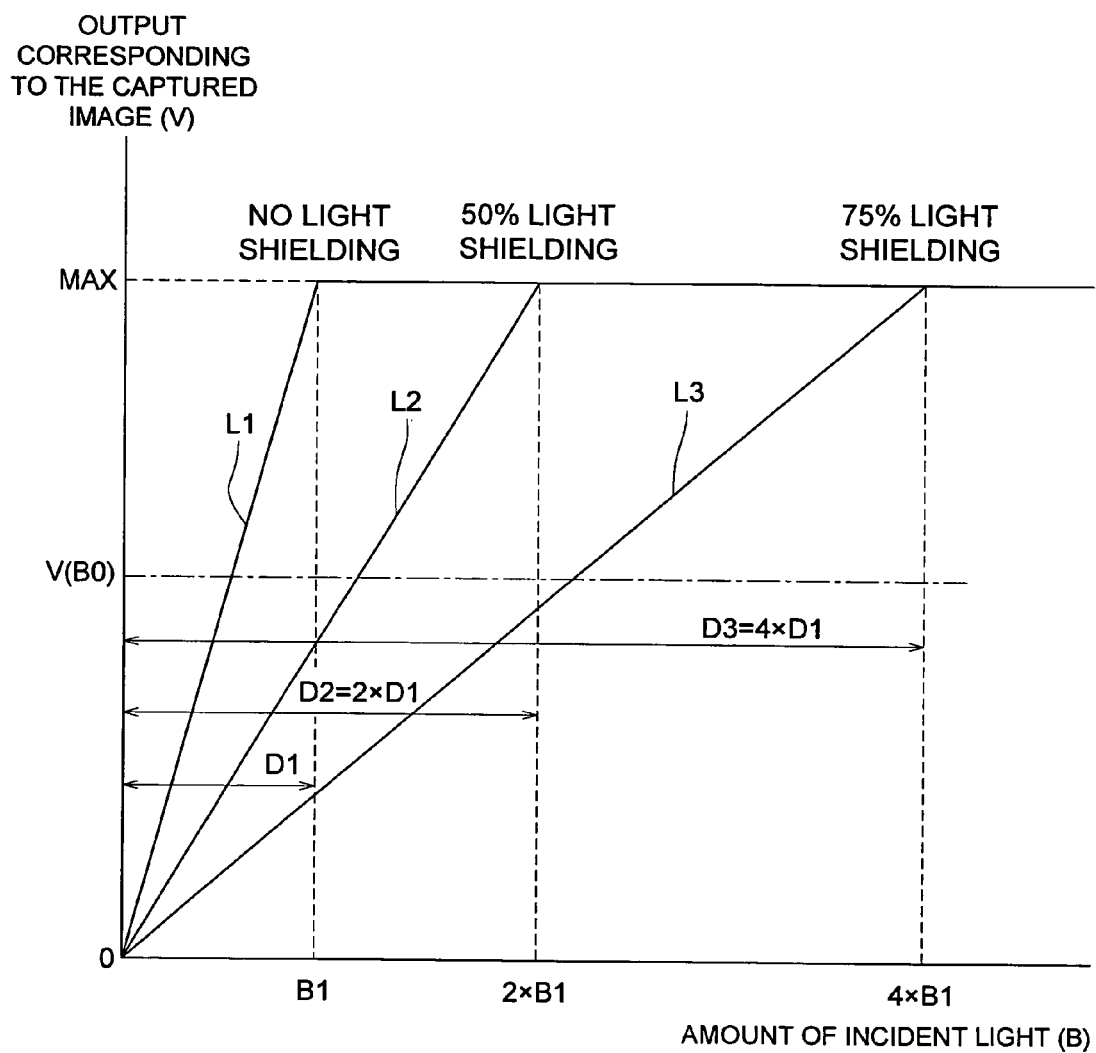
FIG. 6 is a schematic diagram showing the relationship between light shielding and dynamic range in the present invention; namely, a chart representing the photoelectric conversion characteristics wherein the X axis indicates the amount of incident light (B) and the Y axis indicates the output corresponding to the captured image (V)

The following describes the relationship between light shielding and dynamic range in the photoelectric conversion section 111, with reference to FIG. 6. FIG. 6 is a schematic diagram showing the relationship between light shielding and dynamic range in the photoelectric conversion section 111. It is a chart representing the photoelectric conversion characteristics wherein the X axis indicates the amount of incident light (B) and the Y axis indicates the output corresponding to the captured image (V).

When light is not blocked, the output corresponding to the captured image (V) has linearity, as shown by the L1 of FIG. 6, in the range where the amount of incident light (B) is from 0 (zero) to B1. When the amount of incident light is equal to or greater than B1, saturation occurs at the maximum value (V=MAX). (Actually, such problems as smear or blooming may occur to the CCD and other types of sensor when a high brightness of B1 or more has been reached. For simplicity, such a problem will be included in saturation). The dynamic range in this case is assumed as D1.

When 50% of the light is blocked, namely, when the photoelectric conversion section 111 is subjected to 50-percent light shielding, the output corresponding to the captured image (V) has linearity in the range where the amount of incident light (B) is from 0 (zero) to 2×B1, as shown by the L2 of FIG. 6. If the amount of incident light is equal to or greater than 2×B1, saturation occurs at the maximum value. This will result in the dynamic range D2=2×D1 in this case, showing that the dynamic range has doubled. In the same way, when the photoelectric conversion section 111 is subjected to 75-percent (three-fourth) light shielding, dynamic range D3=4×D1 will result, as shown by the L3 of FIG. 6. To be more specific, the dynamic range has quadrupled.

Such being the case, if a light shielding element 112 is provided for each pixel 110 of the image pickup device 100, as shown in FIG. 1 (*a*), for example, the amount of light shielding can be adjusted for each pixel. The pixels exposed to intense incident light are provided with greater amount of light shielding while the pixels exposed to weak incident light are provided with smaller amount of light shielding. This arrangement allows the dynamic range to be controlled for each pixel without sacrificing the sensitivity.

If the light shielding elements 112 are arranged as shown in FIGS. 1 (*b*) and (*c*), the dynamic range can be controlled with a plurality of pixels as one group. As described above, this makes it possible to control the dynamic range for each set of the pixels constituting the color, and to control the dynamic range for each position on the imaging area or for each of the horizontal or vertical lines.

Figure 7:
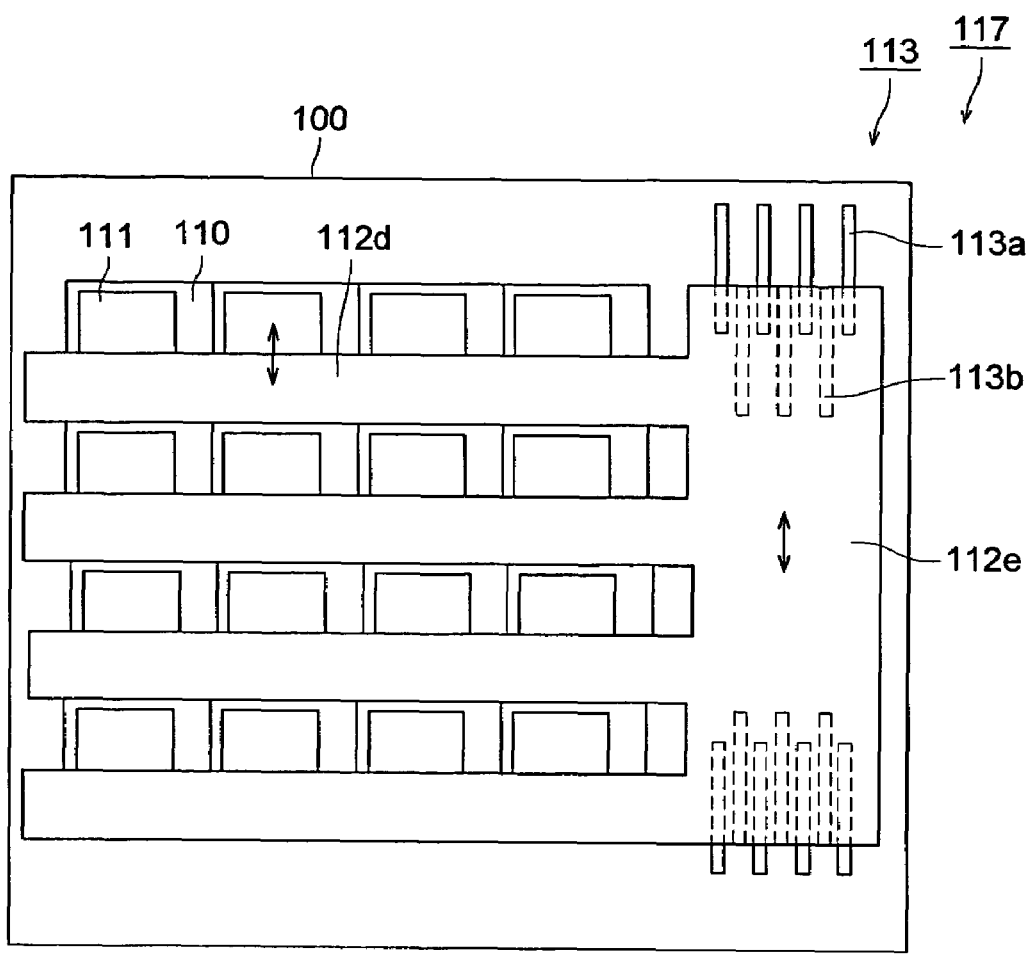
FIG. 7 is a schematic diagram representing a fourth embodiment of the light shielding device in the present invention.

Referring to FIG. 7, the following describes the fourth embodiment of the light shielding device 117 in the present invention. FIG. 7 is a schematic diagram representing a fourth embodiment of the light shielding device 117 in the present invention. This is an example wherein the light shielding elements 112*a* as the first embodiment shown in FIG. 3 (*a*), FIG. 3 (*b*) are integrated for all the pixels of the image pickup device 100. In FIG. 7, in the light shielding element 112*d*, the light shielding elements 112*a* of FIG. 3 (*a*), FIG. 3 (*b*) are connected for each row in the horizontal direction of the pixels. They are further connected integrally in the vertical direction outside the area where the pixels are arranged on the image pickup device 100.

The second comb electrode 113*b* constituting the light shield drive section 113 is provided on the underside surface of the connecting section 112*e*. Outside the area where the pixels are located on the image pickup device 100, the first comb electrode 113*a* is arranged on the surface of the portion opposed to the second comb electrode 113*b*. By controlling the voltage applied between the first comb electrode 113*a* and the second comb electrode 113*b*, the light shielding elements 112*d* of all the pixels are collectively moved for simultaneous change of the shielded areas of all the pixels. This arrangement makes it possible not only to control the amount of exposure of the pixel 110, but also to implement the shutter function wherein all the pixels of the image pickup device 100 are simultaneously exposed.

According to the present embodiment, the moving distance of the light shielding element 112*d* is as small as that of the photoelectric conversion section 111. This provides a high-speed operation. The shutter speed is much higher than that of the conventional mechanical shutter. Further, exposure timing does not vary according to the position on the image pickup device as is the case with the conventional focal plane shutter. Since simultaneously exposure of all pixels is possible, no distortion occurs in the case of a fast moving subject.

In the image synthesis method by extracting the appropriate exposure portion from a plurality of images with different exposure times, as one of the conventional methods for expanding the dynamic range, a very short exposure time can be achieved by using the present embodiment. Saturation does not occur easily to the image pickup device even on a very bright portion. This arrangement greatly expands the dynamic range as compared to the conventional method.

In the example shown in FIG. 7, in the light shielding element 112*d*, the light shielding elements 112*a* of FIG. 3 (*a*), FIG. 3 (*b*) are connected for each row in the horizontal direction of the pixel. Further, outside the area where the pixels are arranged on the image pickup device 100, they are integrally connected in the vertical direction. Without being restricted to this example, they can be connected for each row in the vertical direction, and outside the pixel area, they are connected in the horizontal direction.

In the example given in FIG. 7, the light shielding element 112*d* is connected on one side alone (right side in FIG. 7) in the vertical direction. However, a connecting section may be provided on the left side of FIG. 7, and the first and second comb electrodes may be provided on the connecting section on the left. In this case, there will be an increase in the size of the portion where the connecting section is arranged. Despite this disadvantage, the driving force of the light shielding element 112*d* is increased and the mechanical strength is also increased. This arrangement allows a faster shutter function to be implemented.

Figure 8:
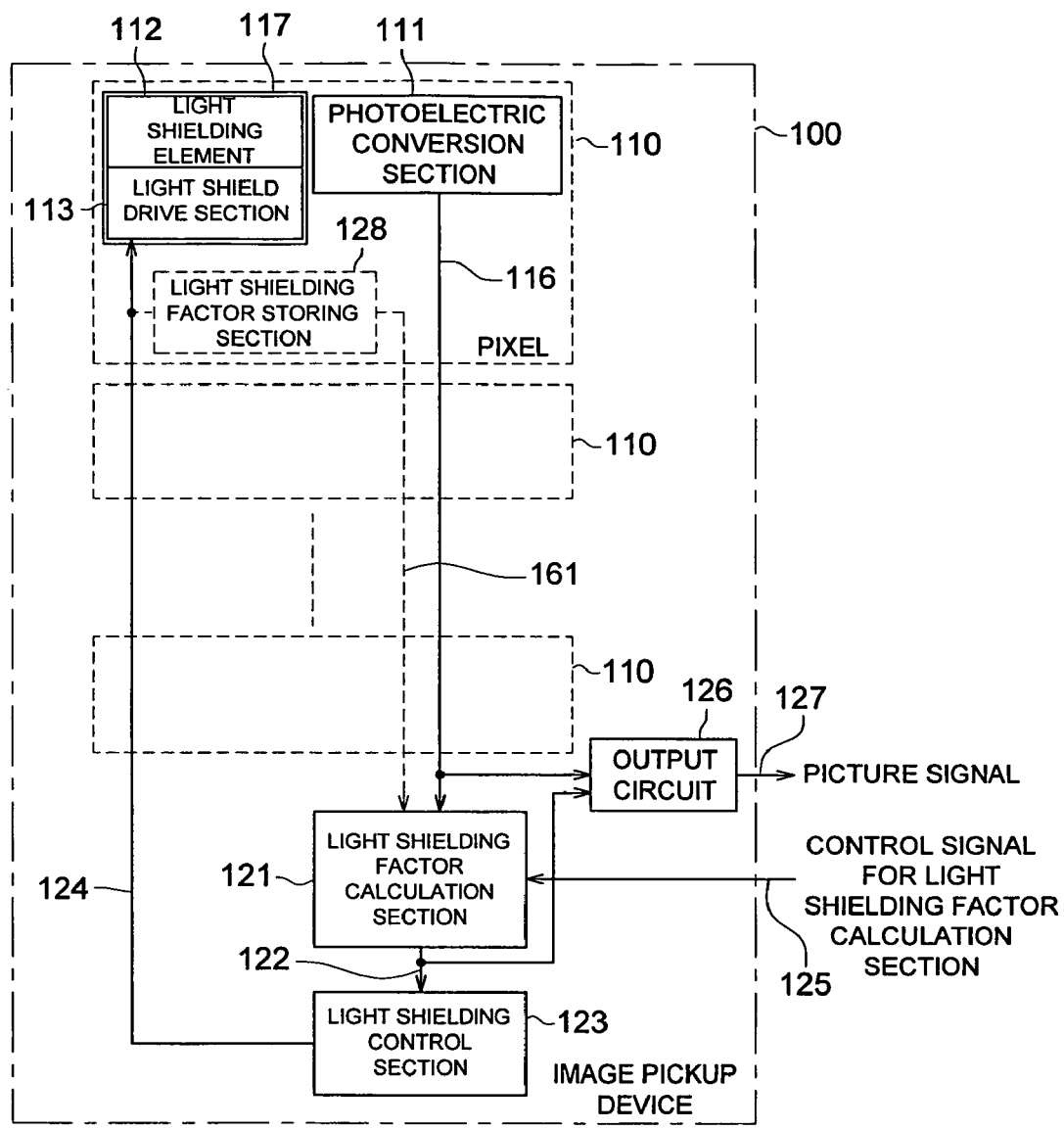
FIG. 8 is a diagram showing a first embodiment of the image pickup device in the present invention; namely, a block diagram showing the circuit of one of the pixels of the image pickup device.
Figure 9:
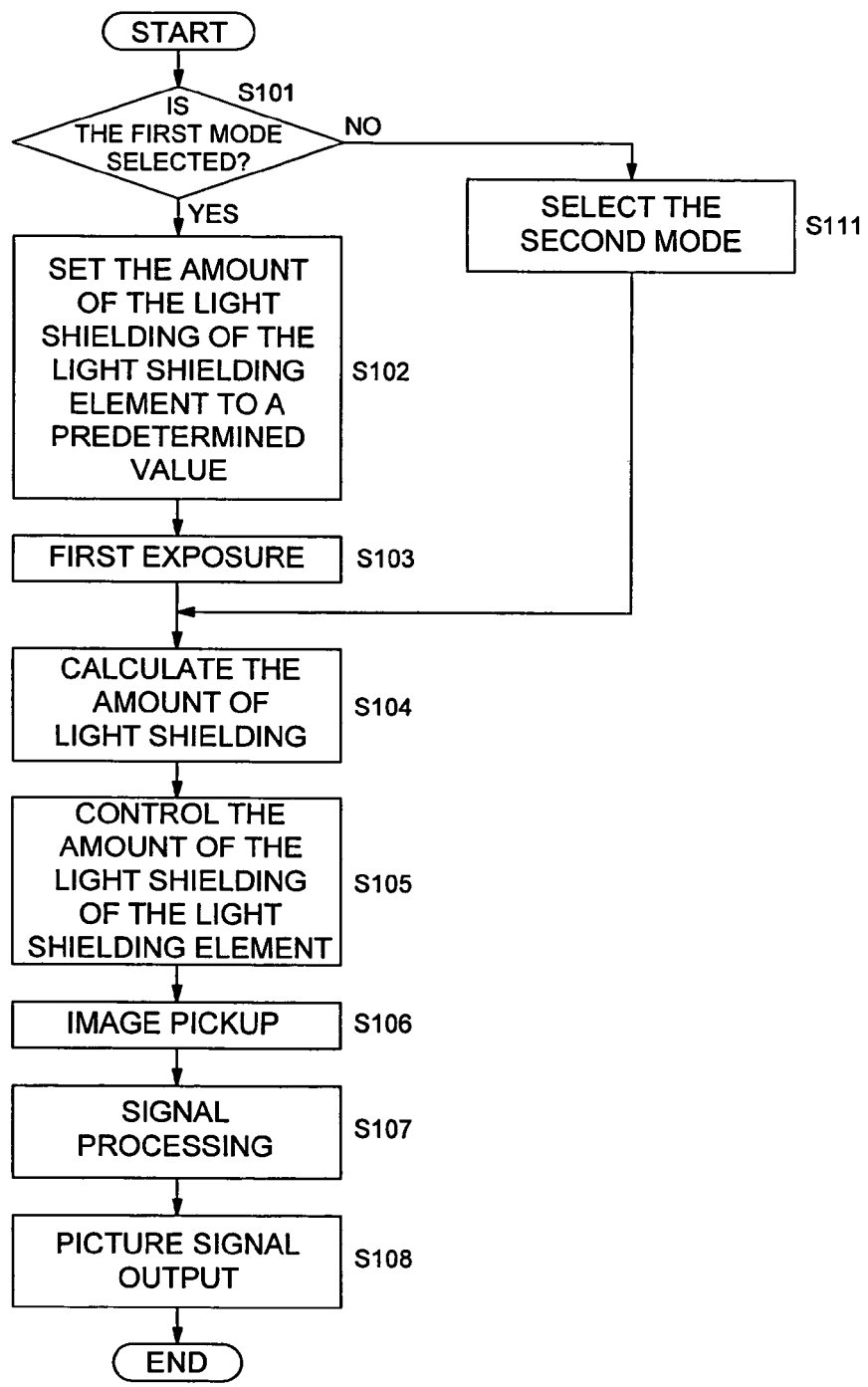
FIG. 9 is a flowchart showing the flow of the operations in the circuit block given in FIG. 8.

The following describes the first embodiment of the drive control of the light shielding device 117 with reference to FIG. 8 and FIG. 9.

FIG. 8 is a diagram showing a first embodiment of the image pickup device in the present invention; namely, a block diagram showing the circuit of pixel 110 as one of the pixels of the image pickup device. FIG. 9 is a flowchart showing the flow of the operations in the circuit block given in FIG. 8.

In FIG. 8, the pixel 110 contains a photoelectric conversion section 111 and light shielding device 117 formed of a light shielding element 112 and light shield drive section 113. The image pickup device 100 is formed of a plurality of pixels 110 and the peripheral circuit including the light shielding factor calculation section 121 (to be described later), light shielding control section 123 and output circuit 126.

The photoelectric conversion output 116 of the photoelectric conversion section 111 is inputted into the light shielding factor calculation section 121, and the light shielding factor control value 122 calculated by the light shielding factor calculation section 121 is inputted into the light shielding control section 123. The light shield drive section 113 is driven by the light shielding control output 124 of the light shielding control section 123 so that the amount of light shielding of the light shielding element 112 is controlled. The operation of the light shielding factor calculation section 121 is controlled by the light shielding factor calculation section control signal 125 from the external circuit (not illustrated). In the meantime, photoelectric conversion output 116 of the photoelectric conversion section 111 and the light shielding factor control value 122 calculated by the light shielding factor calculation section 121 are inputted into the output circuit 126 as well. After having been subjected to a predetermined signal processing such as signal amplification and noise reduction by the output circuit 126, they are outputted as the picture signal 127 to the external circuit (not illustrated).

It is also possible to provide a light shielding factor storing section 128 for storing the light shielding factor for each pixel 110, as shown by a broken line in FIG. 8. The light shielding factor storing section 128 is formed of a capacitor arranged inside the pixel 110. For example, when it is parallel-connected with the first comb electrode 113a and the second comb electrode 113b as shown in FIG. 3 (a), FIG. 3 (b), electrostatic force between the first comb electrode 113a and the second comb electrode 113b can be maintained for a longer time in a more stable manner. This arrangement allows the light shielding factor of the light shielding element 112 to be maintained in a more stable manner despite longer second exposure, namely, even if a longer period is required between control of the amount of light shielding of the light shielding element 112 to the completion of image pickup. When simultaneous light shielding of a plurality of pixels is to be performed by one light shielding element 112, one light shielding factor storing section 128 may be provided for each group of such pixels.

Referring to FIG. 9, the following describes the flow of the drive control of the light shielding device 117 in the image pickup device 100 shown in FIG. 8. FIG. 9 is a flowchart showing the flow of the drive control of the light shielding device 117 in one image pickup operation in the image pickup device 100.

In Step S101, the control of the light shielding device 117 is checked, and a decision step is taken to determine whether the first mode has been selected or not. The first mode is defined as the mode of "expanding the dynamic range". If the first mode has been selected (Yes in Step 101), processing of Step S102 is applied. If the first mode has not been selected (No in Step 101), the second mode is selected in the Step S111 and processing is applied. The second mode is defined as the mode for "performing a shutter operation".

In the Step S102, the light shield drive section 113 is driven and the light shielding factor of the light shielding element 112 is set to a predetermined value. In Step S103, the first exposure of the photoelectric conversion section 111 is performed faster than in the normal image pickup operation. Then the system goes to Step S104.

In the Step S111, exposure computation is carried out by an external circuit (not illustrated) to adjust the exposure time and aperture value. The light shielding factor calculation section control signal 125 corresponding to the appropriate aperture and shutter speed is outputted to the light shielding factor calculation section 121. Then the system goes to Step S104.

In Step S104, based on the photoelectric conversion output 116 of the photoelectric conversion section 111 by the first exposure in the Step S103 or the light shielding factor calculation section control signal 125 outputted in the Step S111, the amount of light shielding at the time of image pickup is calculated by the light shielding factor calculation section 121. In the Step S105, based on the light shielding factor control value 122 calculated by the light shielding factor calculation section 121, the light shield drive section 113 is driven by the light shielding control output 124 of the light shielding control section 123 to control the amount of light shielding of the light shielding element 112. In the Step S106, image pickup is performed. After that, the photoelectric conversion output 116 of the photoelectric conversion section 111 is sent to the output circuit 126. In the Step S107, predetermined signal processing such as signal amplification and noise reduction is implemented by the output circuit 126. After that, in the Step S108, the resulting signal is outputted as a picture signal 127 to the external circuit (not illustrated).

If a light shielding factor storing section 128 is additionally provided in FIG. 8, as shown by the broken line in FIG. 8, the stored value 161 of the light shielding factor of the light shielding factor storing section 128 for storing the current light shielding factor in the light shielding element 112 is inputted into the light shielding factor calculation section 121. Then the light shielding factor calculation section 121 can calculate the light shielding factor control value 122, based on the photoelectric conversion output 116 and the stored value 161 of the light shielding factor. This eliminates the need of the first exposure as well as the operations in the Step S102 and Step S103, whereby further enhanced high-speed operations are ensured.

In the present embodiment, for example, when the FT (Frame Transfer) type CCD is used as the image pickup device, one may wish to discontinue entry of the light to the photoelectric conversion section 111 until the photoelectric conversion output 116 of the photoelectric conversion section 111 is sent to the output circuit 126 after completion of image pickup in the Step S105. In the FT type CCD, the photoelectric conversion section 111 per se is used as a transmission line of the photoelectric conversion output 116. Accordingly, entry of light during the transmission will cause the photoelectric conversion output 116 per se to be changed. In this case, a shutter apparatus can be provided separately from the present image pickup unit. Alternatively, as described above, to ensure complete light shielding upon completion of image pickup in the Step S106, the light shielding device 117 of the present image pickup unit can be used as a shutter. In the former case, control of the light shielding device 117 will be simplified. In the latter case, there will be no need of separately installing a shutter.

When the amount of light shielding is calculated at the time of image pickup in the Step S104, as described above with reference to FIG. 6, if it has been determined from the result of the first exposure that the amount of incident light is insufficient for a pixel (a dark pixel), the amount of light shielding is reduced for that pixel. If it has been determined that the amount of incident light is excessive for a pixel (a bright pixel), the amount of light shielding amount is increased for that pixel. This procedure will provide the pixel of the dark portion with sufficient sensitivity. For the pixel of the very bright portion, saturation of the photoelectric conversion section 111 will be discouraged. This will ensure expansion of the dynamic range as an object of the present invention.

The control signal 125 for the light shielding factor calculation section inputted into the light shielding factor calculation section 121 is mainly formed of the signal for controlling the calculation timing. It may include the information of the pixel 110 as an object of calculating the amount of light shielding, for example, information of the pixel position on the image pickup device 100 and filter color. If the amount of light shielding is calculated based on such information, partial exposure control and color balance correction processing will be simplified.

In the present embodiment, processing in Step S102 can be omitted in the second image pickup operation and thereafter, and the first exposure can be performed using the same amount of light shielding as in the previous image pickup operation. This eliminates the need of controlling the light shielding element 112 twice, and hence ensures a still higher speed.

Figure 10:
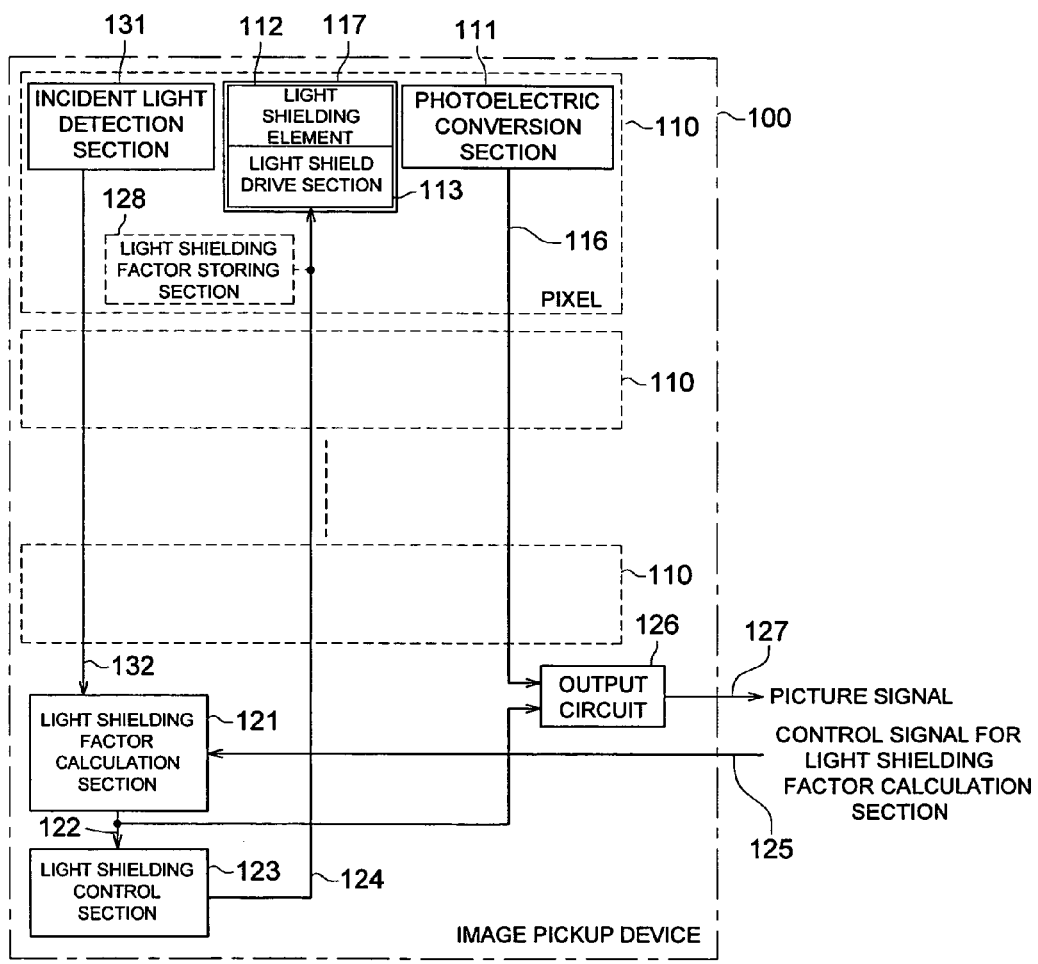
FIG. 10 is a diagram showing a second embodiment of the image pickup device in the present invention; namely, a block diagram showing the circuit of one of the pixels of the image pickup device.
Figure 11:
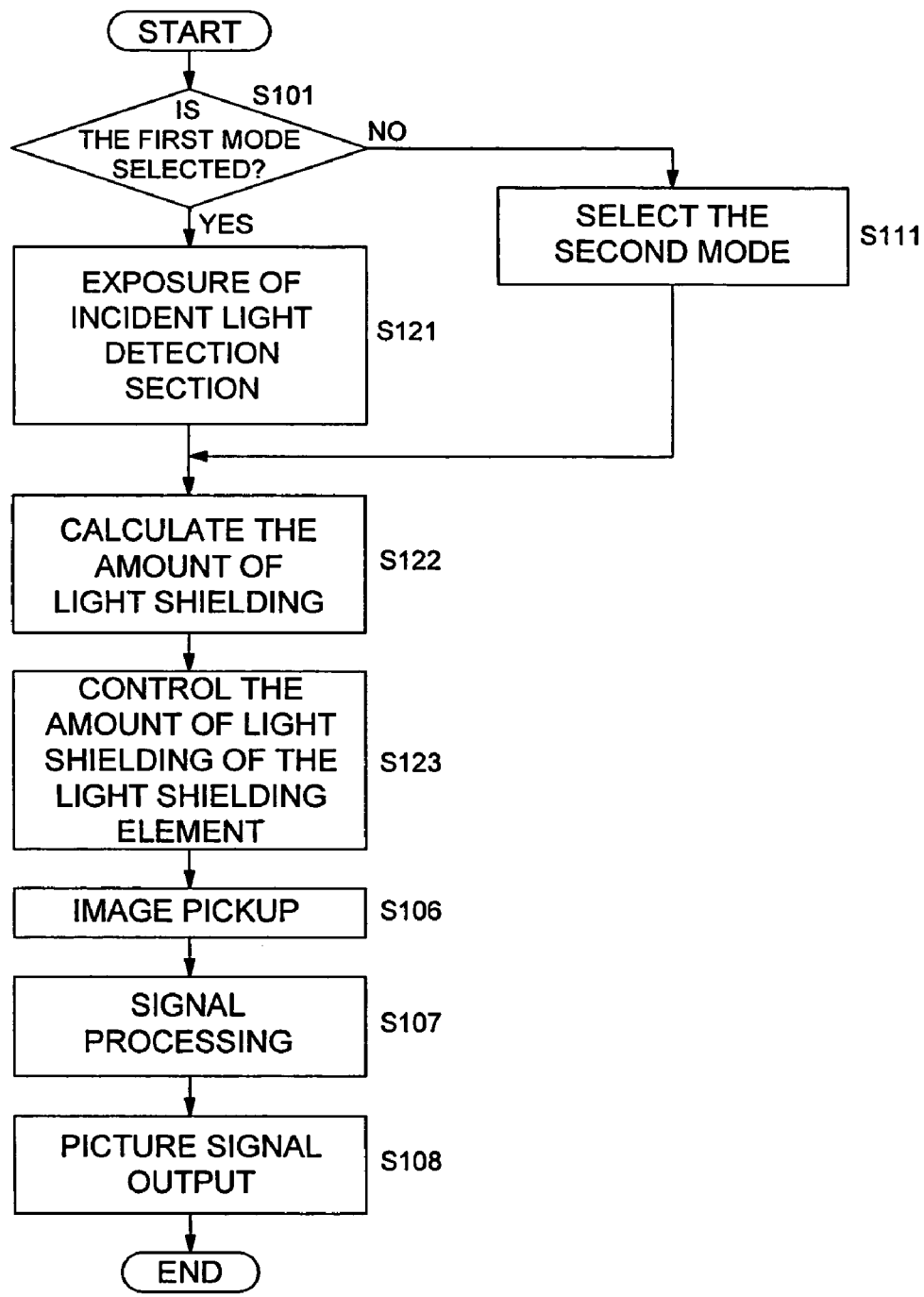
FIG. 11 is a flowchart showing the flow of the operations in the circuit block given in FIG. 10.
Figure 12:
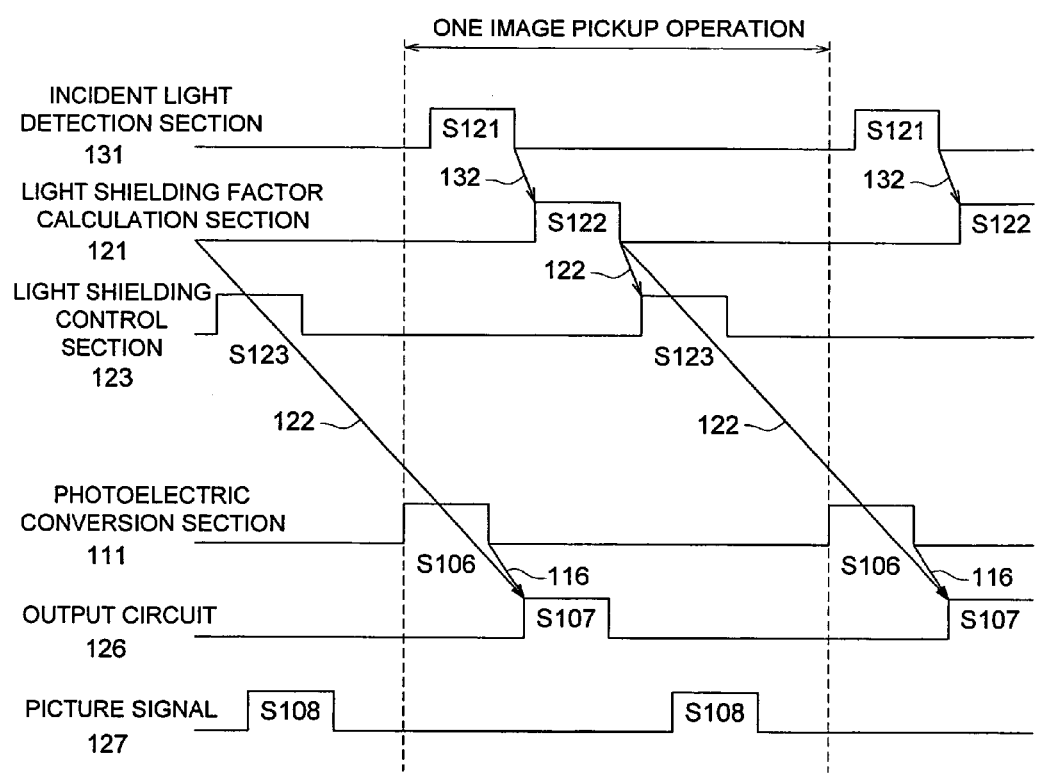
FIG. 12 is a timing chart showing the operation timing of the light shielding device in the present invention.

Referring to FIG. 10, FIG. 11 and FIG. 12, the following describes the second embodiment of the drive control of the light shielding device 117:

FIG. 10 is a block diagram showing the circuit for the pixel 110 as one of the pixels of the image pickup device 100. FIG. 11 is a flowchart showing the flow of the operations in the circuit block given in FIG. 10. FIG. 12 is a timing chart showing the operation timing of in the flow chart shown in FIG. 11.

In FIG. 10, the pixel 110 is provided with an incident light detection section 131 for detecting the amount of incident light. The incident light detection section 131 is only required to be arranged at a position not subjected to light shielding by the light shielding element 112. It may be placed on the pixel 110 or on the light shielding element 112. The output signal 132 corresponding to the amount of incident light of the incident light detection section 131 is inputted into the light shielding factor calculation section 121.

As described with reference to FIG. 8, the light shielding factor storing section 128 for storing the light shielding factor shown by the broken line in FIG. 10 may be added for each pixel 110. This will provide the same advantage as that described with reference to FIG. 8.

In the flow chart of FIG. 11, a decision step is taken in the Step S101 to determine if the first mode has been selected or not. If the first mode has been selected (Yes in Step S101), processing of the light shielding factor calculation section 121 is applied. If the first mode is not selected (No in Step S101), the second mode will be selected in the Step S111 and processing will be implemented.

In the Step S121, the amount of incident light is detected by exposure of the incident light detection section 131. In the Step S122, based on the output signal 132 corresponding to the amount of incident light from the incident light detection section 131, the amount of light shielding at the time of image pickup is calculated by the light shielding factor calculation section 121. In the Step S123, based on the light shielding factor control value 122 having been calculated by the light shielding factor calculation section 121, the light shield drive section 113 is driven by the light shielding control output 124 of the light shielding control section 123 to control the amount of light shielding of the light shielding element 112. The processing hereafter is the same as that having been described with reference to FIG. 9, and will not be described to avoid duplication.

Referring to FIG. 12, the following describes the drive control timing for the light shielding device 117: In the Step S121, the incident light detection section 131 detects the amount of incident light, and sends the output signal 132 corresponding to the amount of incident light to the light shielding factor calculation section 121. In the Step S122, the light shielding factor calculation section 121 calculates the amount of light shielding based on the output signal 132 corresponding to the amount of incident light, and sends the light shielding factor control value 122 to the light shielding control section 123 and output circuit 126. In the Step S123, based on the light shielding factor control value 122, the light shielding factor control section 123 uses the output signal 124 for controlling the light shield to drive the light shield drive section 113, and moves the light shielding element 112 to the corresponding position.

In the meantime, the photoelectric conversion section 111 picks up an image in the Step S106, and sends the photoelectric conversion output 116 to the output circuit 126. In the Step S107, the output circuit 126 applies predetermined signal processing depending on the amount of light shielding such as signal amplification and noise reduction, to the photoelectric conversion output 116. In the Step S108, a picture signal 127 is outputted.

In the present embodiment, calculation of the amount of light shielding for the next image pick operation and control of the light shielding element are performed in parallel during one cycle of image pick operation (from the start of Step S106 to the completion of Step S108). This is followed by the step of calculating the amount of light shielding using the incident light detection section 131 and the step of image pickup operation using the first photoelectric conversion section 111, as described above.

In the flow of the drive control of the light shielding device 117 in the first embodiment shown in FIG. 9, the image pickup operation in the photoelectric conversion section 111 requires two image pickup operations of the first exposure in the Step S103 and the second exposure in the Step S106. This requires time before the picture signal 127 can be obtained. In the present embodiment, however, the image pickup operation in the photoelectric conversion section 111 is limited only to the image pickup operation performed in the Step S106. This reduces the time to get the picture signal 127.

Similarly to the aforementioned description with reference to FIG. 9, in this example, if it has been determined that the amount of incident light is insufficient for a pixel (a dark pixel), the amount of light shielding is reduced for that pixel. If it has been determined that the amount of incident light is excessive for a pixel (a bright pixel), the amount of light shielding is increased for that pixel. This procedure will provide the pixel of the dark portion with sufficient sensitivity. For the pixel of the very bright portion, saturation of the photoelectric conversion section 111 will be discouraged. This will ensure expansion of the dynamic range as an object of the present invention.

Figure 13:
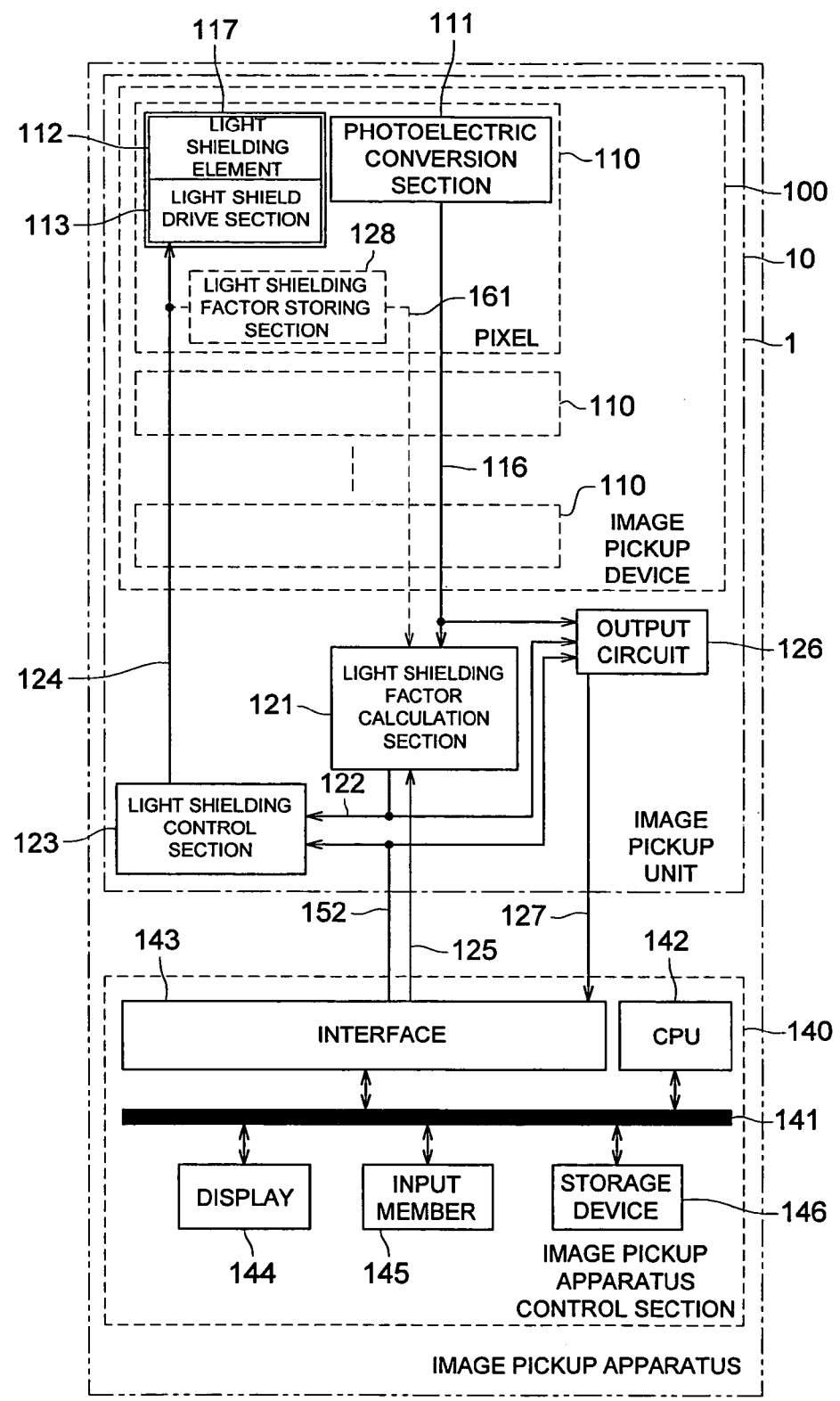
FIG. 13 is a block diagram showing the circuit of the image pickup apparatus as a first embodiment of the image pickup unit using the image pickup device provided with the light shielding device of the present invention.
Figure 14:
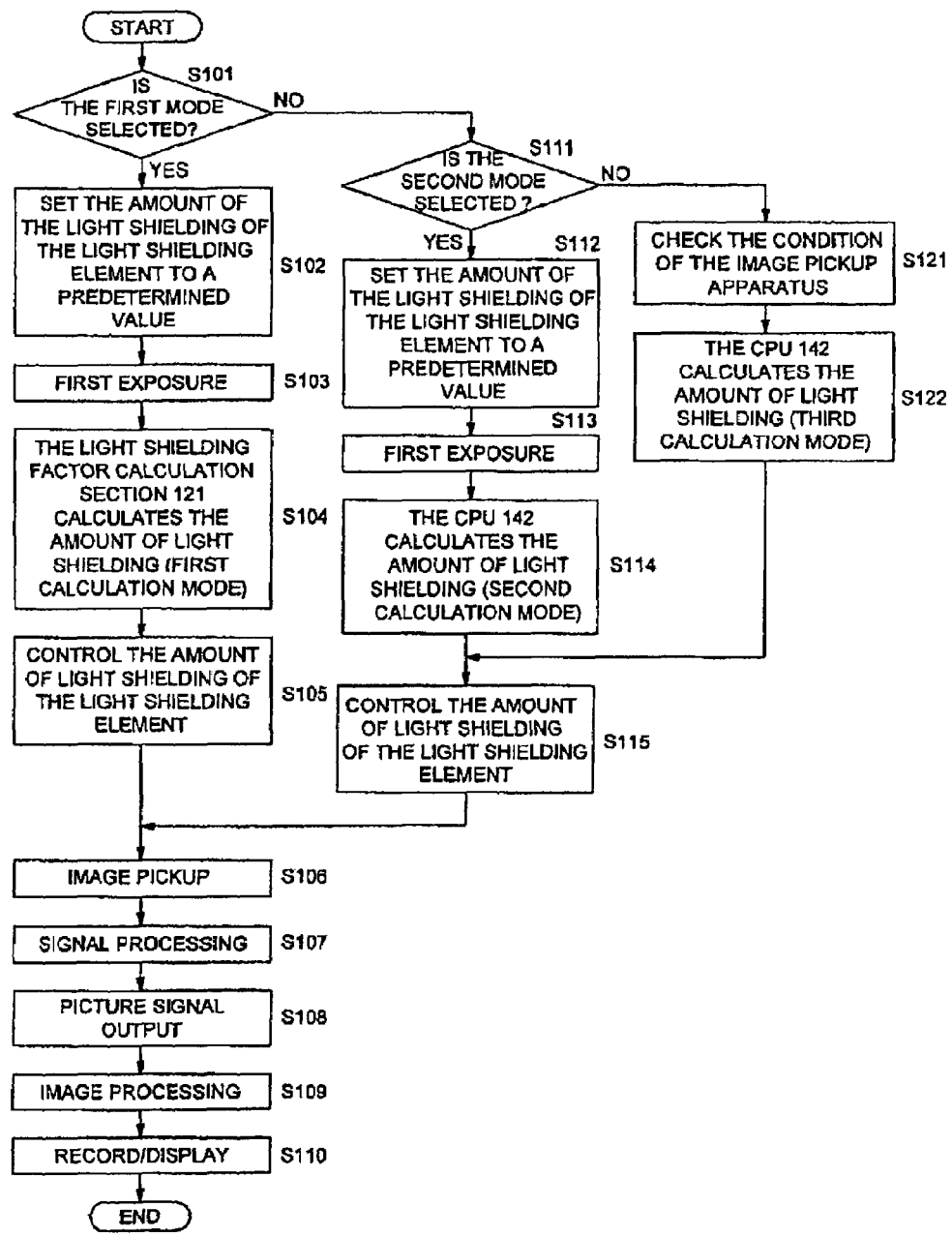
FIG. 14 is a flow chart showing the operation flow of the circuit block given in FIG. 13.

Referring to FIG. 13 and FIG. 14, the following describes the first embodiment of the image pickup unit in the present invention based on an example of the image pickup apparatus.

FIG. 13 is a block diagram showing the circuit of the image pickup apparatus 1 of the pixel 110 as one of the image pickup devices 100. It contains an image pickup unit 10 and an image pickup apparatus control section 140 functioning as an image pickup control section.

Each of the pixels 110 contains photoelectric conversion section 111 and a light shielding device 117 made up of a light shielding element 112 and light shield drive section 113. The image pickup device 100 is formed of a plurality of pixels 110 and peripheral circuit (not illustrated). The image pickup unit 10 is made up of the image pickup device 100 and the peripheral circuit containing the light shielding factor calculation section 121 (to be described later), light shielding control section 123 and output circuit 126.

The peripheral circuit containing the light shielding factor calculation section 121, light shielding control section 123 and output circuit 126 will be described as a circuit independent of the image pickup device 100. It goes without saying that it can be included in the image pickup device 100, as shown in FIG. 8. It is not particularly difficult to integrate the CMOS type image pickup device, for example. When the aforementioned peripheral circuit has been integrated, the image pickup device per se will operate as an image pickup unit.

The photoelectric conversion output 116 of the photoelectric conversion section 111 is inputted into the light shielding factor calculation section 121, and the light shielding factor control value 122 calculated in the light shielding factor calculation section 121 is inputted into the light shielding control section 123. The light shield drive section 113 is driven by the light shielding control output 124 of the light shield control section 123, whereby the amount of light shielding of the light shielding element 112 is controlled. The operation of the light shielding factor calculation section 121 is controlled by the light shielding factor calculation section control signal 125 of the image pickup apparatus control section 140.

In the meantime, the photoelectric conversion output 116 of the photoelectric conversion section 111 and the light shielding factor control value 122 having been calculated by the light shielding factor calculation section 121 are inputted to the output circuit 126 as well. After having been subjected to a predetermined signal processing such as signal amplification and noise reduction by the output circuit 126, they are outputted as the picture signal 127 to the CPU 142 through the interface 143 of the image pickup apparatus control section 140 located outside the image pickup unit 10. The CPU 142 applies predetermined image processing to the picture signal 127 according to the program stored in the storage device 146 such as a flash memory and hard disk, and allows it to be indicated on the display 144 or stored in the storage device 146.

As shown by the broken line of FIG. 13, the light shielding storing section 128 for storing the light shielding factor may be added for each pixel 110. The light shielding factor storing section 128 is formed of the capacitor provided inside the pixel, for example. When it is connected in parallel with the aforementioned first comb electrode 113a and the second comb electrode 113b shown in FIG. 3 (a), FIG. 3 (b), electrostatic force between the first comb electrode 113a and the second comb electrode 113b can be maintained for a longer time in a more stable manner. This arrangement allows the amount of light shielding of the light shielding element 112 to be maintained in a more stable manner despite longer second exposure, namely, even if a longer period is required between control of the amount of light shielding of the light shielding element 112 and the completion of image pickup. When simultaneous light shielding of a plurality of pixels is to be performed by one light shielding element 112, one light shielding factor storing section 128 may be provided for each group of such pixels. When simultaneous light shielding of a plurality of pixels is to be performed by one light shielding element 112, one light shielding factor storing section 128 may be provided for each group of such pixels.

The light shielding device 117 can be controlled in the following three modes: The first and the second modes are intended to expand the dynamic range.

In the first mode, the amount of light shielding is calculated by the light shielding factor calculation section 121 on the image pickup unit 10, based on the photoelectric conversion output 116 (the first calculation mode). The light shielding factor control value 122 having been calculated is inputted into the light shielding control section 123. The light shield drive section 113 is driven by the light shielding control output 124 of the light shielding control section 123, and the amount of light shielding of the light shielding element 112 is controlled.

In the second mode, the amount of light shielding is calculated by the CPU 142 based on the picture signal 127 having been inputted into the interface 143 (the second calculation mode). The second light shielding factor control value 152 having been calculated is inputted into the light shielding control section 123 via the interface 143. The light shield drive section 113 is driven by the light shielding control output 124 of the light shielding control section 123, and the amount of light shielding of the light shielding element 112 is controlled. In other words, the CPU 142 functions as a light shielding factor calculation section.

In the first and the second modes, if it has been determined that the amount of incident light is insufficient for a pixel (a dark pixel), the amount of light shielding is reduced for that pixel. If it has been determined that the amount of incident light is excessive for a pixel (a bright pixel), the amount of light shield is increased for that pixel. This procedure will provide the pixel of the dark portion with sufficient sensitivity. For the pixel of the very bright portion, saturation of the photoelectric conversion section 111 will be discouraged. This will ensure expansion of the dynamic range as an object of the present invention.

In the first mode, only control signal 125 is supplied from the image pickup apparatus control section 140. Calculation of the amount of light shielding inside the image pickup unit 10 can be provided, independently of the CPU 142. This arrangement allows the dynamic range to be expanded, without increasing the workload of the entire system of the image pickup apparatus 1.

Further, in the second mode, the CPU 142 is used as the light shielding factor calculation section. This permits the amount of light shielding to be calculated in more complicated manner than that obtained from the light shielding factor calculation section 121 on the image pickup unit 10, or provides programmable calculation of the amount of light shielding.

In the third mode, the CPU 142 calculates the second amount of light shielding control value 152 according to the program stored in the storage device 146 (third calculation mode), and inputs it into the light shielding control section 123 via the interface 143.

In the third mode, the amount of light shielding can be controlled in the manner similar to the camera aperture, independently of the amount of incident light. Alternatively, control can be provided so that light is completely blocked upon completion of image pickup, thereby getting the same effect as that of a shutter. Particularly, the shutter provides simultaneous exposure of all the pixels (so-called global shutter function) by simultaneous control of the light shielding elements 112 of all the pixels. Further, when the amount of light shielding is adjusted for each pixel in conformity to the image pickup lens to be used, it is possible to correct the reduction of the amount of light in peripheral area of the image pickup unit caused by so-called cosine 4th power law and so on. It goes without saying that control by a combination of the second mode and third mode can be implemented by the use of the CPU 142.

The following describes the first embodiment of the image pickup unit. FIG. 14 is a flow chart showing the drive control flow of the light shielding device 117 for one image pickup operation in the image pickup apparatus 1 shown in FIG. 13.

In Step S101, the control of the light shielding device 117 is checked, and a decision step is taken to determine whether the first mode has been selected or not. The control mode of the light shielding device 117 is selected by the CPU 142, based on the setting of the image pickup operation selected by the input member 145 shown in FIG. 13. For example, if "simple dynamic range expansion mode image pickup" has been selected using the input member 145, the first mode is selected. The second mode is selected if the "high-precision dynamic range expansion mode image pickup" has been selected. The third mode is selected if "high-speed shutter image pickup" has been selected.

If the first mode is selected (Yes in Step S101), processing in Step S102 and thereafter will be applied. In the Step S102, the light shield drive section 113 is driven and the light shielding element 112 is set to a predetermined amount of light shielding. In the Step S103, the first exposure of the photoelectric conversion section 111 is performed faster than in the normal image pickup operation.

In the Step S104 (the first calculation mode), based on the photoelectric conversion output 116 of the photoelectric conversion section 111 by the first exposure in Step S103, the amount of light shielding at the time of image pickup is calculated by the light shielding factor calculation section 121. In the Step S105, based on the light shielding factor control value 122 calculated by the light shielding factor calculation section 121, the light shield drive section 113 is driven by the light shielding control output 124 of the light shielding control section 123, and the amount of light shielding of the light shielding element 112 is controlled. Image pickup operation is performed in the Step S106.

After that, the photoelectric conversion output 116 of the photoelectric conversion section 111 and the light shielding factor control value 122 calculated by the light shielding factor calculation section 121 are sent to the output circuit 126. In the Step S107, they are subjected to a predetermined signal processing such as signal amplification and noise reduction depending on the amount of light shielding by the output circuit 126. After that, in the Step S108, they are outputted as the picture signal 127 to the CPU 142 via the interface 143. In the Step S109, the picture signal 127 is subjected to image processing required for recording and display by the CPU 142. In the Step S110, this signal is recorded in the storage device 146 as a known image file or is indicated on the display 144.

If the first mode is not selected in the Step S101 (No in Step S101), a decision step is taken in the Step S111 to determine if the second mode has been selected or not. If the second mode has been selected (Yes in Step S111), processing in the Step S112 and thereafter will be applied. In the Step S112, the light shield drive section 113 is driven and the light shielding element 112 is set to a predetermined amount of light shielding. In the Step S113, the first exposure of the photoelectric conversion section 111 is performed faster than in the normal image pickup operation.

In the Step S114 (the second calculation mode), based on the photoelectric conversion output 116 of the photoelectric conversion section 111 due to the first exposure in the Step S113, the CPU 142 calculates the amount of light shielding at the time of image pickup operation. The second light shielding factor control value 152 is inputted into the light shielding control section 123. In the Step S115, based on the second light shielding factor control value 152 calculated by the CPU 142. The light shield drive section 113 is driven by the light shielding control output 124 of the light shielding control section 123, and the amount of light shielding of the light shielding element 112 is controlled. Then the system goes to Step S106. The aforementioned operations in Step S106 and thereafter are performed.

If the second mode is not selected in the Step S111 (No in Step S111), the system goes to the Step S121. In the Step S121, various conditions of the image pickup apparatus 1 are confirmed. In the Step S122 (third calculation mode), the CPU 142 performs exposure computation for regulating the exposure time and aperture value. The second light shielding factor control value 152 corresponding to the appropriate aperture and shutter speed is inputted into the light shielding control section 123. Then the system goes to Step S115. After that, the aforementioned operations in Step S115 and thereafter are performed.

If the light shielding factor storing section 128 is additionally provided in FIG. 13, the stored value 161 of the light shielding factor storing section 128 for storing the current amount of light shielding of light shielding element 112 is inputted into the light shielding factor calculation section 121, as shown by the broken line of FIG. 13. This procedure allows the light shielding factor calculation section 121 to calculate the light shielding factor control value 122, based on the photoelectric conversion output 116 and the stored value 161 of light shielding factor. This eliminates the need of the first exposure, and hence the operations in the Step S102 and Step S103 can be omitted. This will ensure a still higher operation speed.

Similarly, the stored value 161 of the light shielding factor is inputted into the CPU 142 via the interface 143. This procedure eliminates the need of the operations in the Step S112 and Step S113. If the CPU 142 is used as a light shielding factor calculation section, the second light shielding factor control value 152 is stored in a storage device 146. This value can be used to calculate the light shielding factor control value 122 for the next image pickup operation.

In the present embodiment, for example, when the FT (Frame Transfer) type CCD is used as the image pickup device, one may wish to discontinue entry of the light to the photoelectric conversion section 111 until the photoelectric conversion output 116 of the photoelectric conversion section 111 is sent to the output circuit 126 after completion of image pickup in the Step S105. In the FT type CCD, the photoelectric conversion section 111 per se is used as a transmission line of the photoelectric conversion output 116. Accordingly, entry of light during the transmission will cause the photoelectric conversion output 116 per se to be changed. In this case, a shutter apparatus can be provided separately from the present image pickup unit. Alternatively, as described above, to ensure complete light shielding upon completion of image pickup in the Step S106, the light shielding device 117 of the present image pickup unit can be used as a shutter. In the former case, control of the light shielding device 117 will be simplified. In the latter case, there will be no need of separately installing a shutter.

When the amount of light shielding is calculated at the time of image pickup in the Step S104, as described above with reference to FIG. 6, if it has been determined from the result of the first exposure that the amount of incident light is insufficient for a pixel (a dark pixel), the amount of light shielding is reduced for that pixel. If it has been determined that the amount of incident light is excessive for a pixel (a bright pixel), the amount of light shielding is increased for that pixel. This procedure will provide the pixel of the dark portion with sufficient sensitivity. For the pixel of the very bright portion, saturation of the photoelectric conversion section 111 will be discouraged. This will ensure expansion of the dynamic range as an object of the present invention.

The control signal 125 inputted into the light shielding factor calculation section 121 is mainly formed of the signal for controlling the calculation timing. It may include the information of the pixel 110 as an object of calculating the amount of light shielding, for example, information of the position of the image pickup device 100 on the chip and filter color. If the amount of light shielding is calculated based on such information, partial exposure control and color balance correction processing on the image will be simplified.

In the present embodiment, processing in Step S102 can be omitted in the second image pickup operation and thereafter, and the first exposure can be performed using the same amount of light shielding as in the previous image pickup operation. This eliminates the need of controlling the light shielding element 112 twice, and hence ensures a still higher speed.

Figure 15:
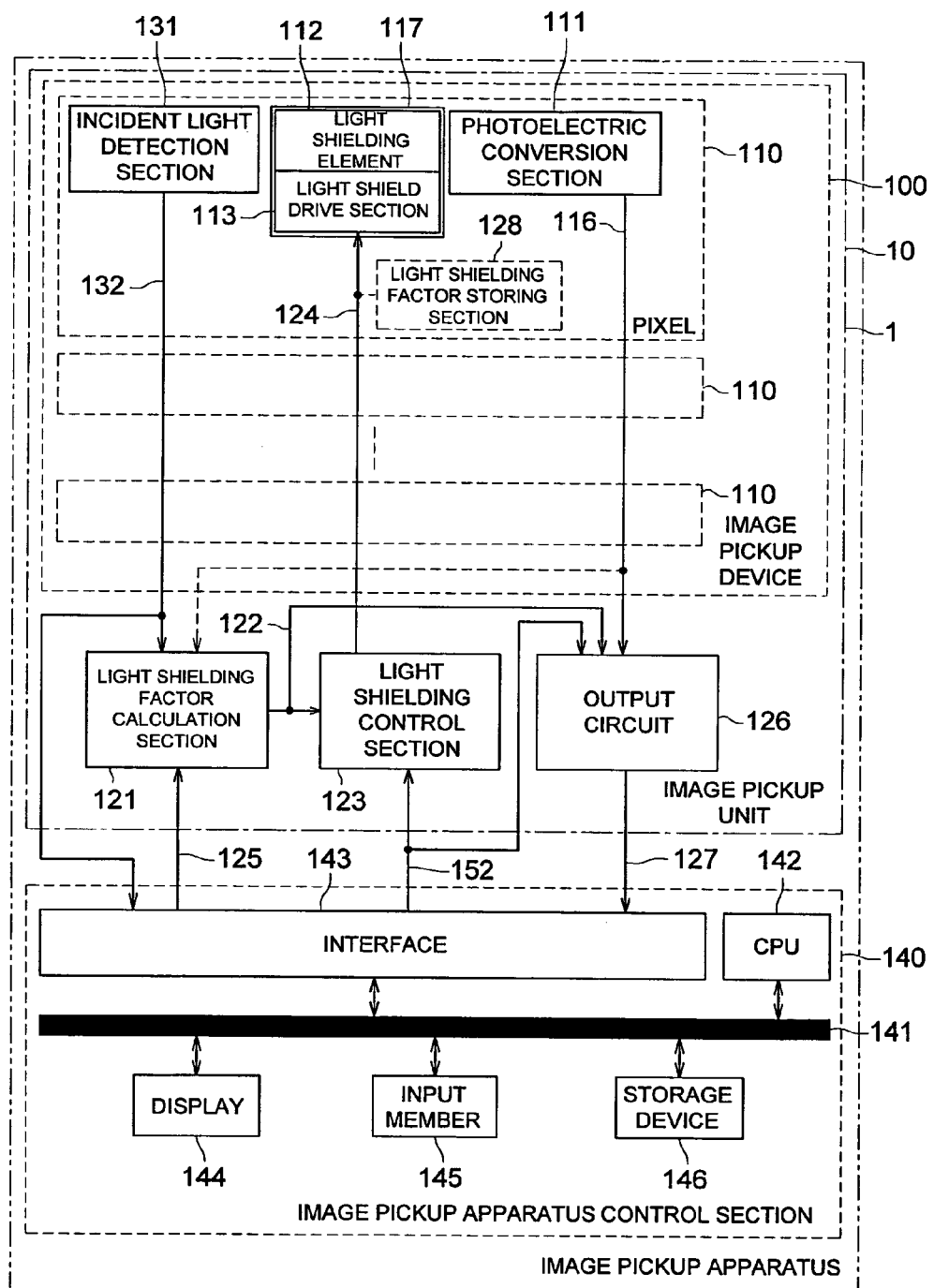
FIG. 15 is a block diagram showing the circuit of the image pickup apparatus as a second embodiment of the image pickup unit using the image pickup device provided with the light shielding device of the present invention.
Figure 16:
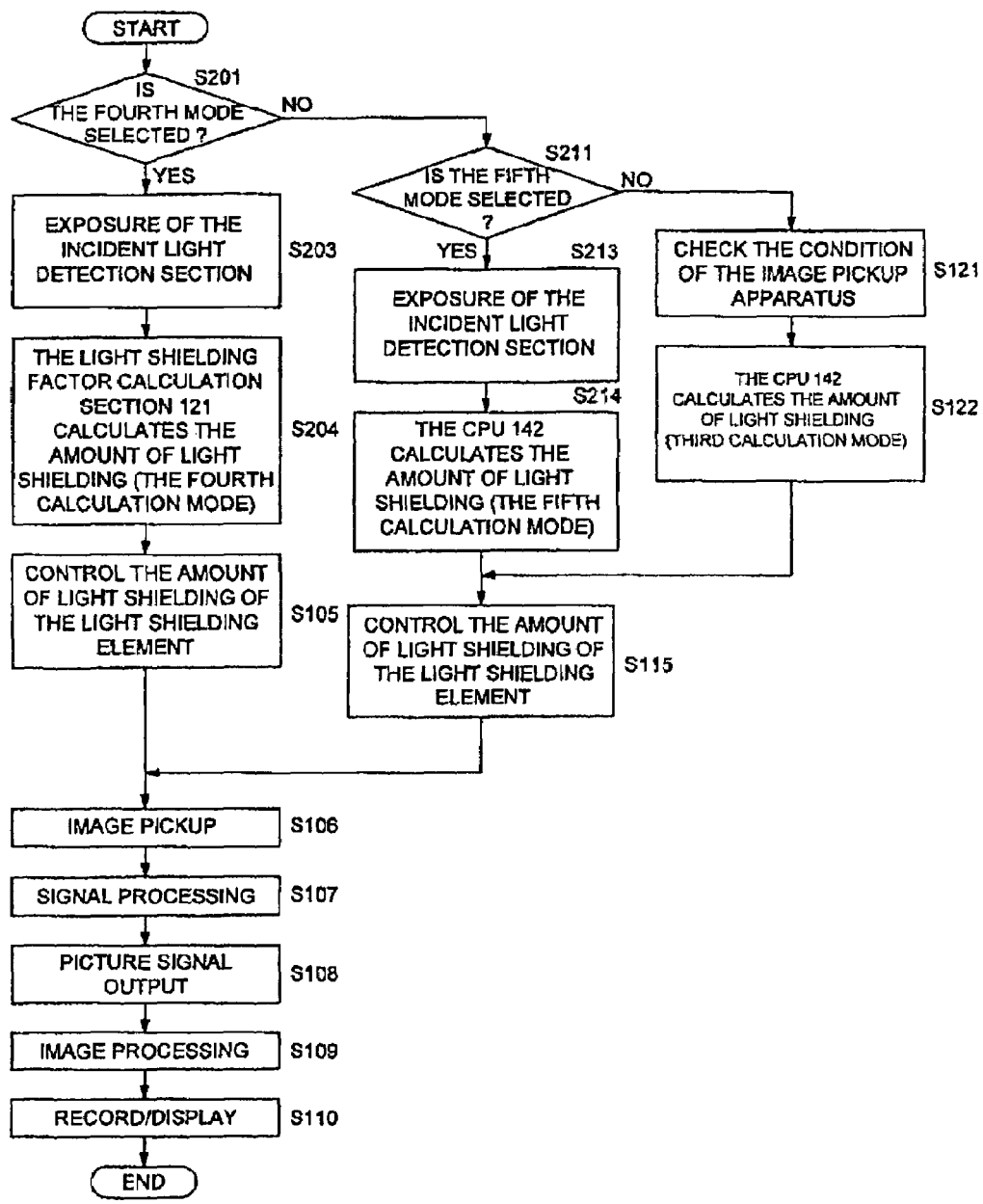
FIG. 16 is a flowchart showing the flow of the operations in the circuit block given in FIG. 15.
Figure 17:
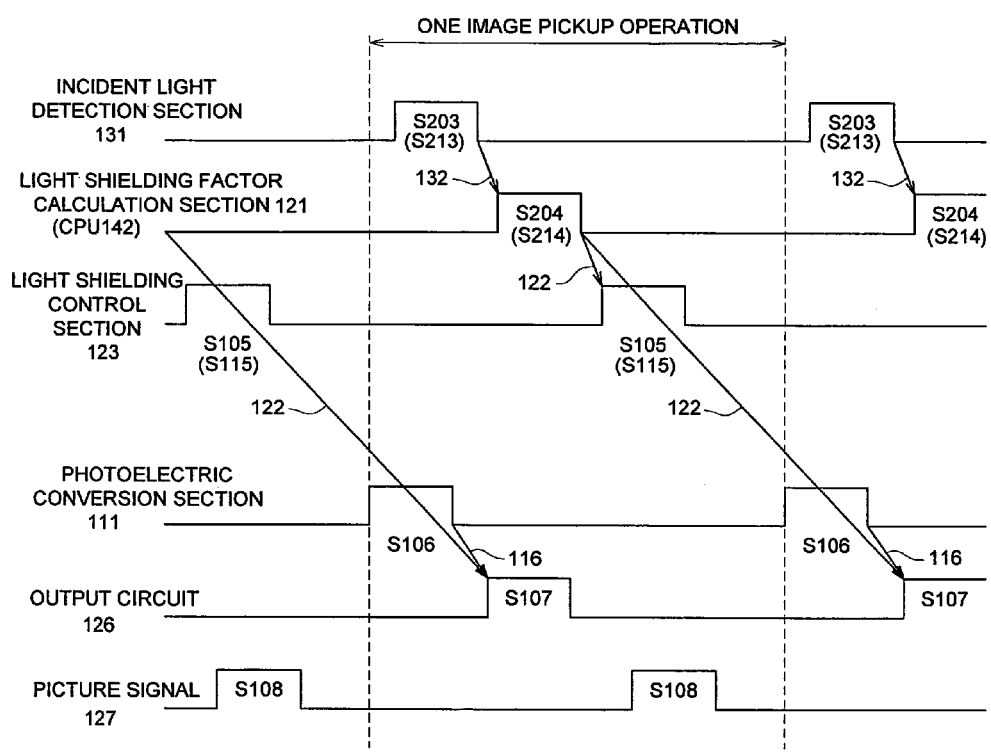
FIG. 17 is a timing chart showing the operation timing of the circuit block given in FIG. 15.

Referring to FIG. 15, FIG. 16 and FIG. 17, the following describes the second embodiment using an example of the image pickup apparatus:

FIG. 15 is a block diagram showing the circuit of the image pickup apparatus 1 of pixel 110 as one of the pixels of the image pickup device 100. It includes the image pickup unit 10 and image pickup apparatus control section 140 serving as an image pickup control section.

In FIG. 15, the pixel 110 is provided with the incident light detection section 131 for detecting the amount of incident light, similarly to the case of FIG. 10. The incident light detection section 131 can be placed at the position not shielded by the light shielding element 112. Alternatively, it can be placed on the pixel 110 or on the light shielding element 112. The output signal 132 corresponding to the amount of incident light of the incident light detection section 131 is inputted into the light shielding factor calculation section 121.

As described with reference to FIG. 13, the light shielding factor storing section 128 for storing the light shielding factor shown by the broken line in FIG. 15 may be added for each pixel 110. This will provide the same advantage as that described with reference to FIG. 13. Further, as shown by the broken line in the FIG. 15, the photoelectric conversion output 116 of the photoelectric conversion section 111 can be inputted into the light shielding factor calculation section 121, and the amount of light shielding can be calculated using the photoelectric conversion output 116, not the output signal 132 corresponding to the amount of incident light of the incident light detection section 131. In this case, the operation is the same as described with reference to FIG. 13 and FIG. 14.

Referring to FIG. 16, the following describes the flow of the drive control of the light shielding device 117 in the image pickup apparatus 1 given in FIG. 15. FIG. 16 is a flowchart showing the flow of the drive control of the light shielding device 117 in one image pickup operation of the image pickup apparatus 1 in the second embodiment.

In Step S201, the control of the light shielding device 117 is checked, and a decision step is taken to determine whether the fourth mode has been selected or not. If the fourth mode has been selected (Yes in Step 201), in Step S203, the exposure of the incident light detection section 131 is performed faster than in the normal image pickup operation. In the Step S204 (the fourth calculation mode), based on the output signal 132 corresponding to the amount of incident light due to the exposure of the incident light detection section 131 in the Step S203, the amount of light shielding at the time of image pickup is calculated by the light shielding factor calculation section 121, and the system goes to Step S105. The processing thereafter is the same as that described with reference to FIG. 14, and will not be described to avoid duplication.

If the fourth mode is not selected in the Step 201 (No in Step S201), a decision step is taken in the Step S211 to determine if the fifth mode has been selected or not. If the fifth mode has been selected (Yes in Step S211), the exposure of the incident light detection section 131 is performed in the Step S213 faster than in the normal image pickup operation. In the Step S214 (the fifth calculation mode), based on the output signal 132 corresponding to the amount of incident light due to the exposure of the incident light detection section 131 in the Step S213, the amount of light shielding at the time of image pickup is calculated by the CPU 142, and the system goes to Step S115. The processing thereafter is the same as that described with reference to FIG. 14, and will not be described to avoid duplication.

If the fifth mode is not selected in the Step S211 (No in Step S211), control is provided in the third mode similarly to the case of FIG. 14. This is the same as that with reference to FIG. 14, and will not be described to avoid duplication.

In the fourth mode, similarly to the first mode shown in FIG. 13, the amount of light shielding is calculated by the light shielding factor calculation section 121 on the image pickup unit 10 (the fourth calculation mode), based on the output signal 132 corresponding to the amount of incident light. The light shielding factor control value 122 having been calculated is inputted into the light shielding control section 123. The light shield drive section 113 is driven by the light shielding control output 124 of the light shielding control section 123, and the amount of light shielding of the light shielding element 112 is controlled.

In the fifth mode, similarly to the second mode shown in FIG. 13, the amount of light shielding is calculated by the CPU 142 (the fifth calculation mode), based on the output signal 132 corresponding to the amount of incident light having been inputted into the interface 143. The second light shielding factor control value 152 having been calculated is inputted into the light shielding control section 123 through the interface 143. The light shield drive section 113 is driven by the light shielding control output 124 of the light shielding control section 123, and the amount of light shielding of the light shielding element 112 is controlled. In other words, the CPU 142 functions as a light shielding factor calculation section.

The following describes the drive control timing of the light shielding device 117 with reference to FIG. 17. FIG. 17 is an operation timing chart in the fourth and fifth modes in the flow chart shown in FIG. 16. The same portions as those of FIG. 13 through FIG. 16 will be assigned with the same reference numerals and will not be described to avoid duplication.

When the fourth mode is selected in the Step S201, the incident light detection section 131 detects the amount of incident light in the S203, and sends the output signal 132 corresponding to the amount of incident light to the light shielding factor calculation section 121. In the Step S204, the light shielding factor calculation section 121 calculates the amount of light shielding, based on the output signal 132 corresponding to the amount of incident light, and sends the light shielding factor control value 122 to the light shielding control section 123 and output circuit 126. In the Step S105, the light shielding factor control section 123 drives the light shield drive section 113 according to light shielding control output 124 based on the light shielding factor control value 122, and shifts the light shielding element 112 to the corresponding position.

In the meantime, the photoelectric conversion section 111 performs image pickup operation in the Step S106, and sends the photoelectric conversion output 116 to the output circuit 126. In the Step S107, the output circuit 126 applies predetermined signal processing depending on the amount of light shielding such as signal amplification and noise reduction, to the photoelectric conversion output 116. In the Step S108, a picture signal 127 is outputted.

If the fifth mode has been inputted in the Step S211, the incident light detection section 131 detects the amount of incident light in the Step S213, and sends the output signal 132 corresponding to the amount of incident light to the CPU 142. In the Step S214, based on the output signal 132 corresponding to the amount of incident light, the CPU 142 calculates the amount of light shielding and sends the second light shielding factor control value 152 to the light shielding control section 123 and output circuit 126. In the Step S115, based on the second light shielding factor control value 152, the light shielding control section 123 drives the light shield drive section 113 according to the light shielding control output 124, and shifts the light shielding element 112 to the corresponding position. The operations thereafter are the same as those described above, and will not be described again to avoid duplication.

In the present embodiment, calculation of the amount of light shielding for the next image pickup operation and control of the light shielding element are performed in parallel during one cycle of image pickup operation (from the start of Step S106 to the completion of Step S108). This is followed by the step of calculating the amount of light shielding using the incident light detection section 131 and the step of image pickup operation using the first photoelectric conversion section 111, as described above.

In the flow of the drive control of the light shielding element 112 in the first embodiment shown in FIG. 14, the image pickup operation in the photoelectric conversion section 111 requires two operations; the first exposure in the Step S103 or 113 and image pickup operation in the Step S106. This requires time before the picture signal 127 can be obtained. In the present embodiment, however, the image pickup operation in the photoelectric conversion section 111 is limited only to the image pickup operation performed in the Step S106. This reduces the time to get the picture signal 127.

Similarly to the aforementioned description with reference to FIG. 14, in this example, if it has been determined that the amount of incident light is insufficient for a pixel (a dark pixel), the amount of light shielding is reduced for that pixel. If it has been determined that the amount of incident light is excessive for a pixel (a bright pixel), the amount of light shielding is increased for that pixel. This procedure will provide the pixel of the dark portion with sufficient sensitivity. For the pixel of the very bright portion, saturation of the photoelectric conversion section 111 will be discouraged. This will ensure expansion of the dynamic range as an object of the present invention.

Further, in the flow of the drive control of the light shielding device 117 in the first embodiment shown in FIG. 14, the image pickup operation in the photoelectric conversion section 111 requires two operations; the first exposure in the Step S103 or 113 and image pickup operation in the Step S106. This requires time before the picture signal 127 can be obtained. In the present embodiment, however, the image pickup operation in the photoelectric conversion section 111 is limited only to the image pick operation performed in the Step 106. This reduces the time to get the picture signal 127.

Figure 18:
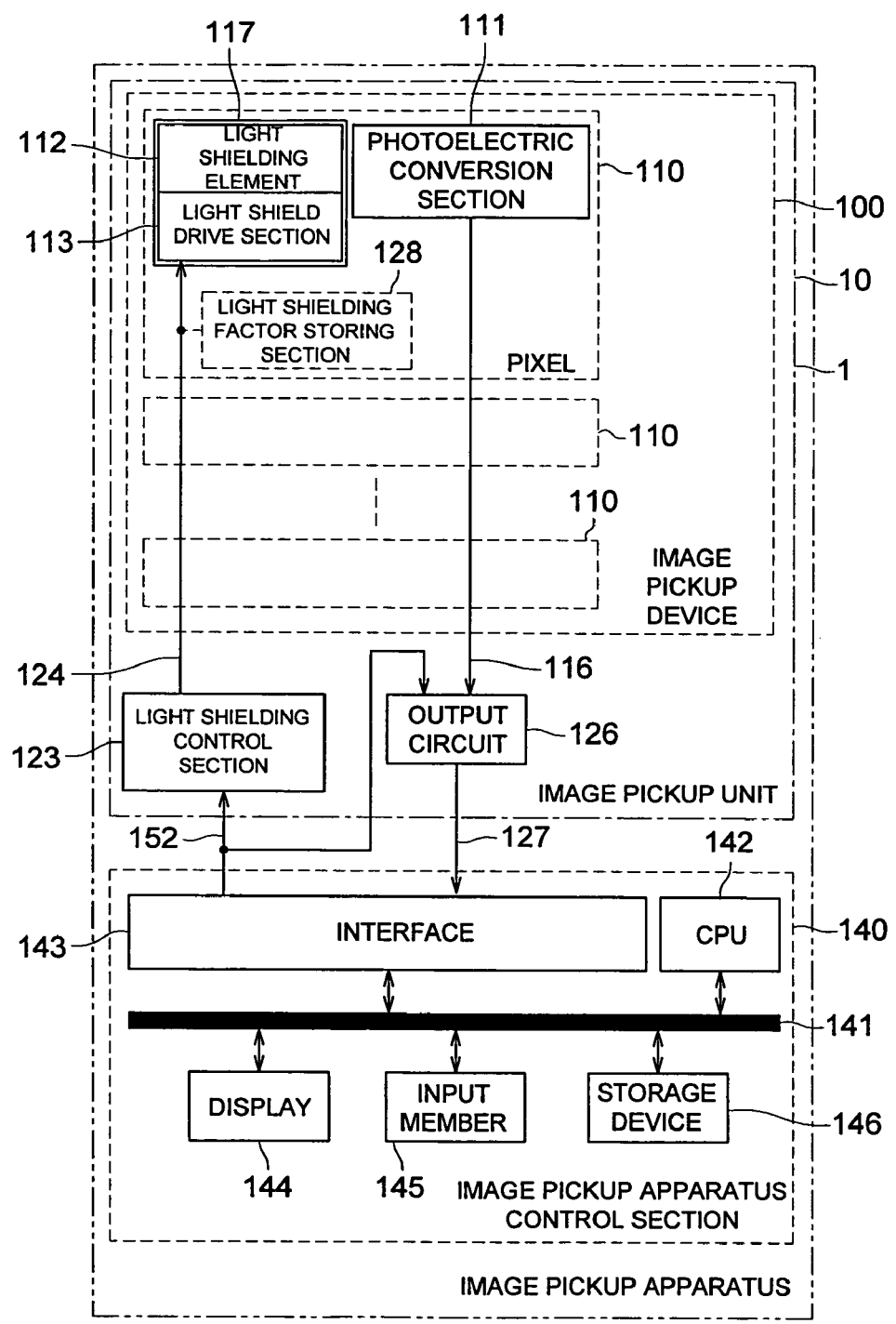
FIG. 18 is a block diagram showing the circuit of the image pickup apparatus as a third embodiment of the image pickup unit using the image pickup device provided with the light shielding device of the present invention.
Figure 19:
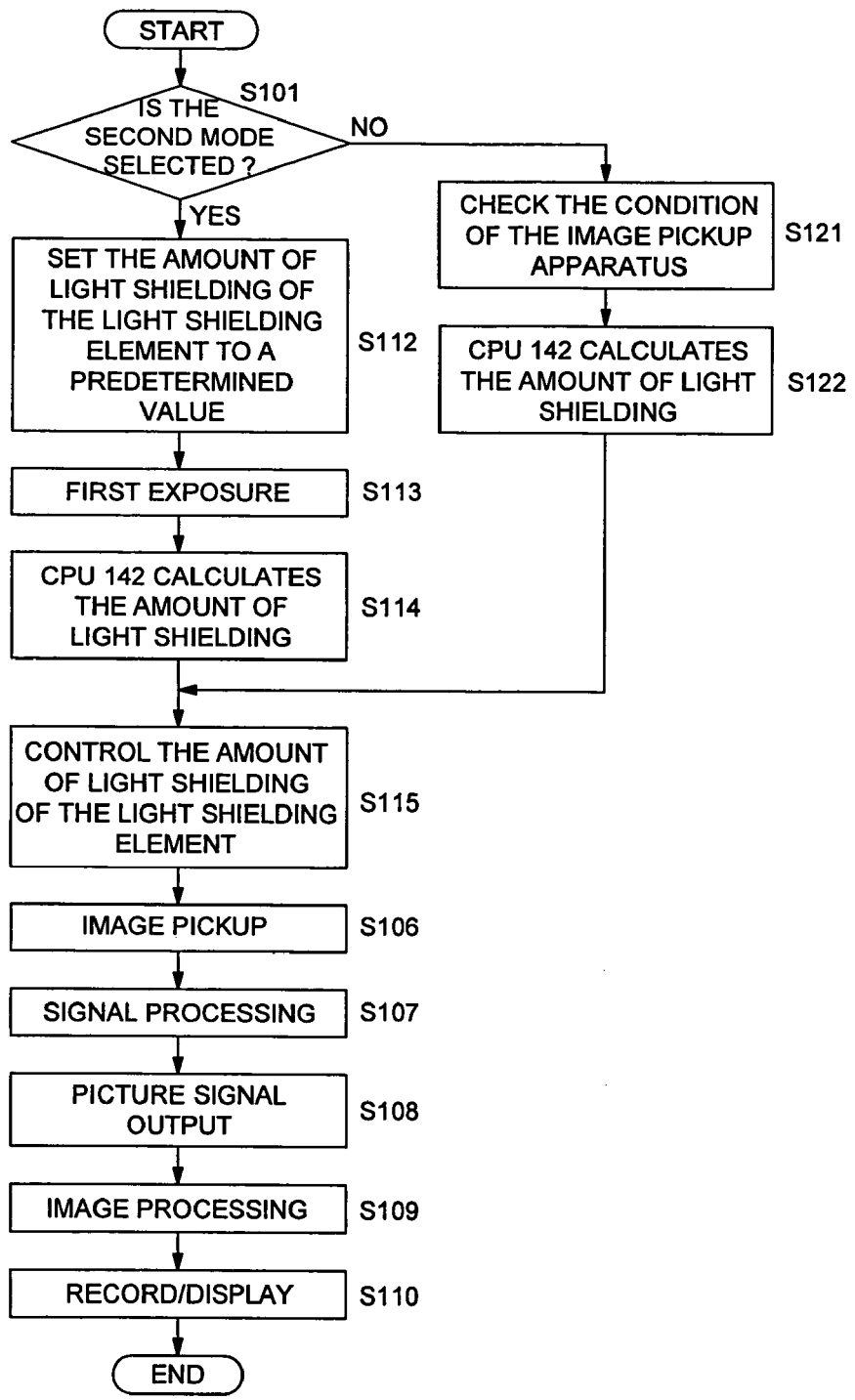
FIG. 19 is a flowchart showing the flow of the operations in the circuit block given in FIG. 18.

Referring to FIG. 18 and FIG. 19, the following describes the third embodiment of the image pickup unit in the present invention based on an example of the image pickup apparatus.

FIG. 18 is a block diagram showing the circuit of the image pickup apparatus 1 of the pixel 110 as one of the image pickup devices 100. As compared with FIG. 13, the light shielding factor calculation section 121 is removed from the image pickup unit 10 in FIG. 18.

In FIG. 18, the light shielding factor calculation section 121 is removed from the image pickup unit 10 as compared with FIG. 13. Accordingly, there is no light shielding factor control value 122 in FIG. 18. Further, the photoelectric conversion output 116 of the photoelectric conversion section 111 is inputted into the output circuit 126 alone. The first of three control modes in the light shielding device 117 is not present. Otherwise, FIG. 18 is the same as FIG. 13.

Referring to FIG. 19, the following describes the flow of the drive control of the light shielding device 117 in the image pickup apparatus 1 given in FIG. 18. FIG. 19 is a flowchart showing the flow of the drive control of the light shielding device 117 in one image pickup operation of the image pickup apparatus 1. As described above, of the three control modes of the light shielding device 117 in the first embodiment of the image pickup unit in the present invention, the first mode is not present. In other words, as compared with FIG. 14, the Steps S101 through S105 are absent in FIG. 19.

In the third embodiment, a light shielding factor calculation section 121 requiring a computation function is not provided on the image pickup unit 10. This allows the circuit of the image pickup unit 10 to be reduced. This is advantageous in promoting the compact design and reduced price. Further, the CPU 142 of the image pickup apparatus control section 140 is used to calculate the amount of light shielding. This arrangement ensures sophisticated calculation of the amount of light shielding, and programmed calculation of the amount of light shielding.

Figure 20:
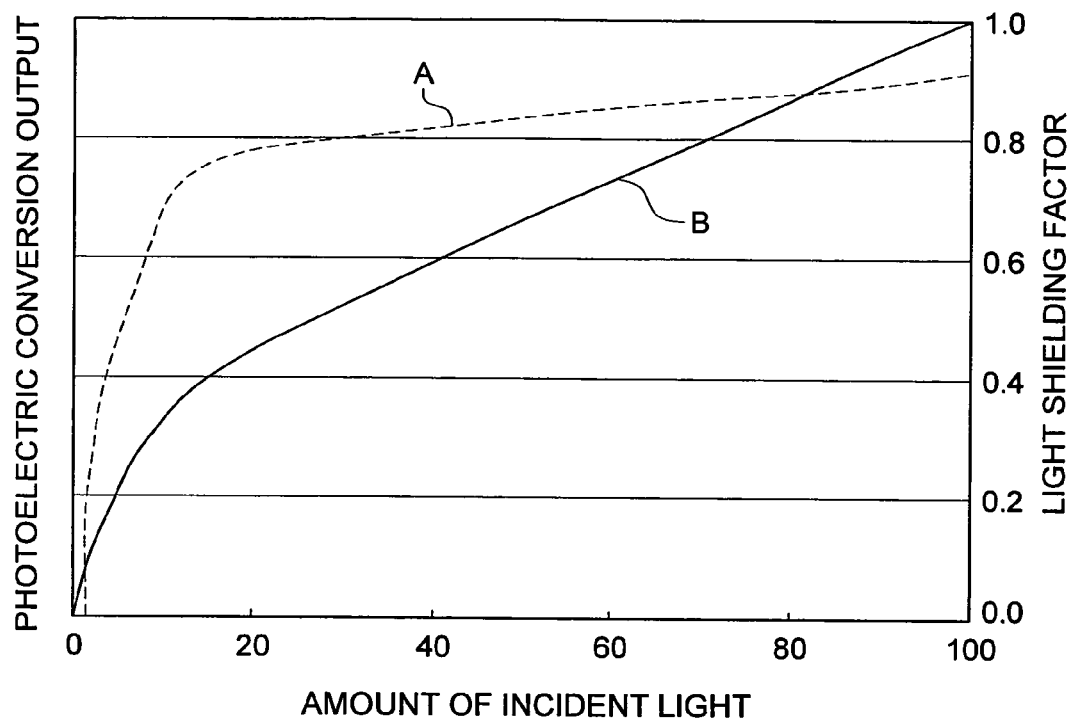
FIG. 20 is a chart showing the relationship between the amount of incident light, photoelectric conversion output and light shielding factor.

Lastly, the following describes an example of the amount of incident light for the pixel 110 and control of the light shielding device 117, with reference to FIG. 20. FIG. 20 is a chart showing the relationship between the amount of incident light to the pixel of image pickup device, photoelectric conversion output of the photoelectric conversion section 111 for this pixel, and light shielding factor of the light shielding element 112. The light shielding factor can be defined as the ratio of the area shielded by the light shielding element 112, with respect to all the light receiving area of the photoelectric conversion section 111. It is synonymous with the amount of light shielding in the present invention.

There is a linear relationship between the amount of incident light and photoelectric conversion output 116, as shown in FIG. 6. It is possible to make sure that the output will not be saturated by switching the light shielding factor. In this case, by switching the light shielding factor, the same photoelectric conversion output 116 is obtained with respect to the different amount of incident light (e.g. V(B0) shown by a one-dot chain line of FIG. 6. Accordingly, in the circuit block diagram shown in FIG. 13, FIG. 15 and FIG. 18, the light shielding factor control value 122 or the second light shielding factor control value 152 is inputted into the output circuit 126, and the relationship between the photoelectric conversion output 116 and the amount of incident light can be converted uniquely, based on this information.

The relation between the amount of incident light and photoelectric conversion output will be considered for unique determination of them. Assume that P denotes the amount of incident light, k indicates the light shielding factor. Then the amount of received light Y of the photoelectric conversion section 111 is given as:

$$Y=(1-k)P \qquad \text{Eq. 1}$$

Assume that k is expressed by the following Eq. 1-1.

[Mathematical Formula 1]

$$k = \begin{cases} 1 - \dfrac{1}{\sqrt{aP}} & (P \geq a) \\ \dfrac{1}{aP} & (P < a) \end{cases} \qquad \text{(Equation 1-1)}$$

[Mathematical Formula 2]

$$Y = \begin{cases} \sqrt{\dfrac{P}{a}} & (P \geq a) \\ \dfrac{P}{a} & (P < a) \end{cases} \qquad \text{(Equation 2)}$$

As an example of non-linear form, the relationship between the amount of received light Y and the amount of incident light P is represented by a square root. Since the relationship between the amount of received light Y and the amount of incident light P is unique, the relationship between the amount of incident light and photoelectric conversion output is determined uniquely. Further, signal compression can be performed and expansion of the dynamic range can be achieved. FIG. 20 is a graphic representation of the relationship of Eq. 2 (where a=1).

When the light shielding factor of the light shielding element 112 is controlled as shown by the curve A of FIG. 20, the photoelectric conversion output 116 shown by the curve B of FIG. 20 exhibits a steeper rise on the less bright side, and a compressed, gentle, near-linear and monotonously increasing form on the brighter side. This shows that a high sensitivity is shown on the less bright side, wherein a big change in the output occurs in response to a slight change in brightness, and expansion of the dynamic range is achieved on the brighter side.

The aforementioned method provides unique determination of the relationship between the amount of incident light and photoelectric conversion output 116. This eliminates the need of inputting the light shielding factor control value 122 or the second light shielding factor control value 152 into the output circuit 126, as shown in FIG. 13, FIG. 15 and FIG. 18. It goes without saying that the function for non-linearization is not restricted to the aforementioned function. To avoid occurrence of quantization noise in the aforementioned computation, the large number of bits are preferably subjected to analog/digital conversion. This is a preferred method for calculation of the amount of light shielding in the image pickup apparatus control section 140.

As described above, the embodiment of the present invention provides an image pickup device, image pickup unit and image pickup apparatus wherein dynamic range can be expanded when a light shielding element for light shielding of the photoelectric conversion section is provided on the pixel, and the amount of light shielding is controlled, and shutter and aperture functions are also available.

The details of the structure and operations of the components constituting the image pickup device, image pickup unit and image pickup apparatus of the present invention can be embodied in a great number of variations with appropriate modification and additions, without departing from the technological spirit and scope of the invention claimed.

What is claimed is:

1. An image pickup device, comprising:
    a plurality of pixels arranged two-dimensionally and used for imaging, each of which has a photoelectric conversion section;
    a light shielding device, the light shielding device including:
        a light shielding element which variably shields all or a part of the photoelectric conversion section of each of the plurality of pixels to be used for image pickup from incident light, the light shielding element having at least one side which is shorter than a pixel pitch of the plurality of pixels, and
        a light shield drive section which moves the light shielding element on the photoelectric conversion section; and
    an incident light detection section which detects the amount of the incident light entering into each of the plurality of pixels.

2. The image pickup device of claim 1, comprising:
    a light shielding factor storing section for storing a light shielding factor which is the amount of light to be blocked by the light shielding device.

3. The image pickup device of claim 1, wherein the light shield drive section moves the light shielding element by electrostatic force or electromagnetic force.

4. The image pickup unit having the image pickup device of claim 1, comprising:
    a light shielding factor calculation section which has a fourth calculation mode in which the amount of light shielding of light to be blocked by the light shielding device is calculated based on the amount of the incident light detected by the incident light detection section; and
    a light shielding control section which controls the light shield drive section to control the amount of light shielding of the light to be blocked by the light shielding device based on a calculation result of the light shielding factor calculation section.

5. The image pickup apparatus having the image pickup unit of claim 4, comprising:
    an image pickup control section which controls the image pickup device to control imaging by the image pickup device,
    the image pickup control section comprises:
        a light shielding factor calculation section which has a fifth calculation mode in which the amount of light shielding of light to be blocked by the light shielding device is calculated based on the amount of the incident light detected by the incident light detection section.

6. An image pickup device, comprising:
    a plurality of pixels arranged two-dimensionally and used for imaging, each of which has a photoelectric conversion section;
    a light shielding device, the light shielding device including:
        a light shielding element which variably shields all or a part of the photoelectric conversion section of each of the plurality of pixels to be used for image pickup from incident light, the light shielding element having at least one side which is shorter than a pixel pitch of the plurality of pixels, and a light shield drive section which moves the light shielding element on the photoelectric conversion section; and a light shielding factor storing section for storing a light shielding factor which is the amount of light to be blocked by the light shielding device.

7. The image pickup unit having the image pickup device of claim 6, comprising:

a light shielding factor calculation section which calculates the amount of light shielding of light to be blocked by the light shielding device based on a photoelectric conversion output of the photoelectric conversion section and a light shielding factor stored in the light shielding factor storing section; and a light shielding control section which controls the light shield drive section to control the amount of light shielding of the light to be blocked by the light shielding device based on a calculation result of light shielding factor calculation section.

8. An image pickup unit, comprising:

an image pickup device, the image pickup device including:

a plurality of pixels arranged two-dimensionally and used for imaging, each of which has a photoelectric conversion section; and a light shielding device, the light shielding device including:

a light shielding element which variably shields all or a part of the photoelectric conversion section of each of the plurality of pixels to be used for image pickup from incident light, the light shielding element having at least one side which is shorter than a pixel pitch of the plurality of pixels, and a light shield drive section which moves the light shielding element on the photoelectric conversion section; and a light shielding control section which controls the light shield drive section to control variably the amount of light shielding of the light shielding device.

9. The image pickup apparatus having the image pickup unit of claim 8, comprising:

an image pickup control section which controls the image pickup device to control imaging by the image pickup device.

10. An image pickup unit, comprising:

an image pickup device, the image pickup device including:

a plurality of pixels arranged two-dimensionally and used for imaging, each of which has a photoelectric conversion section; and a light shielding device, the light shielding device including:

a light shielding element which variably shields all or a part of the photoelectric conversion section of each of the plurality of pixels to be used for image pickup from incident light, the light shielding element having at least one side which is shorter than a pixel pitch of the plurality of pixels, and a light shield drive section which moves the light shielding element on the photoelectric conversion section;

a light shielding factor calculation section which has a first calculation mode in which the amount of light shielding of light to be blocked by the light shielding device is calculated based on a photoelectric conversion output of the photoelectric conversion section; and a light shielding control section which controls the light shield drive section to control the amount of light shielding of the light shielding device based on a calculation result of the light shielding factor calculation section.

11. The image pickup apparatus having the image pickup unit of claim 10, comprising:

an image pickup control section which controls the image pickup device to control imaging by the image pickup device; and an output circuit which outputs the photoelectric conversion output as a picture signal output, the image pickup control section comprises:

a light shielding factor calculation section which has a second calculation mode in which the amount of light shielding of light to be blocked by the light shielding device is calculated based on the picture signal output of the output circuit.

12. The image pickup apparatus having the image pickup unit of claim 10, comprising:

an image pickup control section which controls the image pickup device to control imaging by the image pickup device, the image pickup control section comprises:

a light shielding factor calculation section which has a third calculation mode in which the amount of light shielding of light to be blocked by the light shielding device is calculated based on a condition of the image pickup apparatus.

13. An image pickup device, comprising:

a plurality of pixels arranged two-dimensionally, each of which has a photoelectric conversion section; and a light shielding device, said light shielding device including a light shielding element configured to shield a variable portion, ranging from zero to one-hundred percent, of the photoelectric conversion section of each of the plurality of pixels so that the variable portion of the photoelectric conversion section of each of the plurality of pixels may be simultaneously shielded from incident light during image pickup and a light shield drive section which moves the light shielding element on the photoelectric conversion section.

14. The image pickup device of claim 13, further comprising:

a light shielding factor storing section for storing a light shielding factor which is the amount of light to be blocked by the light shielding device.

15. An image pickup unit having the image pickup device of claim 13, further comprising:

a light shielding control section which controls the light shield drive section to control variably the amount of light shielding of the light shielding device.

16. The image pickup apparatus having the image pickup unit of claim 15, further comprising:

an image pickup control section which controls the image pickup device to control imaging by the image pickup device.

* * * * *

UNITED STATES PATENT AND TRADEMARK OFFICE
CERTIFICATE OF CORRECTION

| | |
|---|---|
| PATENT NO. | : 7,598,478 B2 |
| APPLICATION NO. | : 11/409431 |
| DATED | : October 6, 2009 |
| INVENTOR(S) | : Morimoto et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 651 days.

Signed and Sealed this

Twenty-eighth Day of September, 2010

David J. Kappos
*Director of the United States Patent and Trademark Office*